US012772670B2

(12) United States Patent
Heo et al.

(10) Patent No.: US 12,772,670 B2
(45) Date of Patent: Oct. 20, 2026

(54) LIGHT EMITTING DISPLAY APPARATUS

(71) Applicant: LG Display Co., Ltd., Seoul (KR)

(72) Inventors: Seol Heo, Paju-si (KR); Junsung Ko, Paju-si (KR); Taehyun Kim, Paju-si (KR); Sanghyo Lee, Paju-si (KR)

(73) Assignee: LG Display Co., Ltd., Seoul (KR)

(*) Notice: Subject to any disclaimer, the term of this patent is extended or adjusted under 35 U.S.C. 154(b) by 471 days.

(21) Appl. No.: 18/529,167

(22) Filed: Dec. 5, 2023

(65) Prior Publication Data

US 2024/0206244 A1 Jun. 20, 2024

(30) Foreign Application Priority Data

Dec. 15, 2022 (KR) ........................ 10-2022-0176200

(51) Int. Cl.
*H10K 59/123* (2023.01)
*H10K 59/131* (2023.01)

(52) U.S. Cl.
CPC ......... *H10K 59/123* (2023.02); *H10K 59/131* (2023.02)

(58) Field of Classification Search
CPC ........................... H10K 59/123; H10K 59/131
USPC .......................................................... 349/143
See application file for complete search history.

(56) References Cited

U.S. PATENT DOCUMENTS

2007/0120476 A1* 5/2007 Park ................... H10D 86/0231 313/506
2007/0182914 A1 8/2007 Hwang
2012/0012854 A1 1/2012 Kaneko
2015/0241718 A1 8/2015 Jeong
2019/0019444 A1 1/2019 Jo et al.
2019/0206300 A1* 7/2019 Lee ........................ G09G 3/003
2020/0013992 A1 1/2020 Cheng
2021/0098551 A1 4/2021 Lee et al.
(Continued)

FOREIGN PATENT DOCUMENTS

CN 114823766 A 7/2022
JP 2010-145772 A 7/2010
(Continued)

OTHER PUBLICATIONS

Office Action issued in corresponding Japanese Patent Application No. 2023-207516, dated Oct. 30, 2024.
(Continued)

*Primary Examiner* — Christopher M Raabe
(74) *Attorney, Agent, or Firm* — Morgan, Lewis & Bockius LLP

(57) ABSTRACT

A light emitting display apparatus may include a first anode electrode provided in a subpixel of a first pixel, a second anode electrode provided in a subpixel of a second pixel disposed adjacent to the first pixel, a first driving transistor for supplying power to the first pixel, a second driving transistor for supplying power to the second pixel, a welding contact portion for electrically connecting the second anode electrode to the first driving transistor when an error occurs in the second driving transistor, and a connection electrode including a connection electrode portion overlapped with the welding contact portion, a first protruding portion protruding from the connection electrode portion in a first direction, and a second protruding portion protruding from the connection electrode portion in a second direction.

27 Claims, 13 Drawing Sheets

(56) References Cited

U.S. PATENT DOCUMENTS

| | | | | |
|---|---|---|---|---|
| 2021/0358961 | A1 | 11/2021 | Wu | |
| 2021/0391293 | A1 | 12/2021 | Ikeda et al. | |
| 2022/0052138 | A1 | 2/2022 | Li et al. | |
| 2022/0069053 | A1 | 3/2022 | Choi et al. | |
| 2022/0190096 | A1 | 6/2022 | Park et al. | |
| 2022/0199746 | A1 | 6/2022 | Kim et al. | |
| 2022/0231001 | A1 | 7/2022 | Park et al. | |
| 2023/0209914 | A1* | 6/2023 | Shim | H10K 50/813 257/72 |
| 2024/0164162 | A1* | 5/2024 | Chai | H10K 59/131 |
| 2024/0206254 | A1* | 6/2024 | Lee | H10K 59/131 |
| 2025/0098449 | A1* | 3/2025 | Yuan | H10K 59/122 |

FOREIGN PATENT DOCUMENTS

| | | | |
|---|---|---|---|
| JP | 2019-020720 | A | 2/2019 |
| JP | 2022-545757 | A | 10/2022 |
| KR | 10-2017-0035397 | A | 3/2017 |
| KR | 10-2020-0079740 | A | 7/2020 |
| KR | 10-2021-0039160 | A | 4/2021 |
| KR | 10-2022-0094955 | A | 7/2022 |
| KR | 10-2022-0094956 | A | 7/2022 |
| WO | 2010/116574 | A1 | 10/2010 |
| WO | 2020/179206 | A1 | 9/2020 |

OTHER PUBLICATIONS

Search report under Section 17 issued in corresponding U.K. Patent Application No. GB2318682.8, dated Jun. 10, 2024.

Office Action issued in corresponding Japanese Patent Application No. 2023-207516, dated Nov. 25, 2025. (Note: US 2021/0098551 A1 and US 2021/0358961 A1 were previously cited. ).

Office Action issued in corresponding Japanese Patent Application No. 2023-207516, dated Apr. 28, 2025. (Note: US 2021/0098551 A1, JP 2022-545757 A, US 2022/0199746 A1, JP 2019-020720 A, KR 10-2020-0079740 A, US 2015/0241718 A1, JP 2010-145772 A and WO 2010/116574 A1 were previously cited.).

Office Action issued in corresponding Taiwanese Patent Application 112148513, dated Mar. 19, 2024.

* cited by examiner

LIGHT EMITTING DISPLAY APPARATUS

CROSS-REFERENCE TO RELATED APPLICATIONS

This application claims the benefit of and priority to the Korean Patent Application No. 10-2022-0176200 filed on Dec. 15, 2022, the entirety of which is incorporated herein by reference for all purposes as if fully set forth herein.

BACKGROUND

1. Technical Field

The present disclosure relates to a display apparatus and particularly to, for example, without limitation, a light emitting display apparatus.

2. Discussion of the Related Art

A light emitting display apparatus exhibits a high response speed while maintaining low power consumption. In addition, unlike a liquid crystal display apparatus, the light emitting display apparatus is a self-luminous apparatus which does not require a separate light source, whereby the light emitting display apparatus typically has no problem related with a viewing angle. Thus, the light emitting display apparatus has received attention as a next generation display apparatus.

A light emitting display apparatus displays an image through light emission of a light emitting element including a light emitting layer interposed between two electrodes.

However, in the light emitting display apparatus, a light extraction efficiency is lowered as some of the light emitted from the light emitting element layer is not discharged to the outside due to total reflection on the interface between the light emitting element layer and an electrode and/or between a substrate and an air layer. Accordingly, luminance is reduced due to the low light extraction efficiency, and power consumption is increased in the light emitting display apparatus.

The description provided in the discussion of the related art section should not be assumed to be prior art merely because it is mentioned in or associated with that section. The discussion of the related art section may include information that describes one or more aspects of the subject technology, and the description in this section does not limit the invention.

SUMMARY

The inventors of the present disclosure have recognized the problems and disadvantages of the related art, have performed extensive research and experiments, and have developed a new invention.

In one or more aspects, an object of the present disclosure is to provide a light emitting display apparatus capable of improving a light extraction efficiency of light emitted from a light emitting element.

In one or more aspects, another object of the present disclosure is to provide a light emitting display apparatus capable of improving an aperture ratio.

In one or more aspects, yet another object of the present disclosure is to provide a light emitting display apparatus capable of recognizing a welding portion.

In addition to the objects of the present disclosure as mentioned above, additional objects, aspects, features and advantages of the present disclosure are set forth in the present disclosure and will also be apparent from the present disclosure or may be learned by practice of the inventive concepts provided herein. Other aspects, features and advantages of the present disclosure may be realized and attained by the descriptions provided in the present disclosure, including the claims and the drawings.

In accordance with one or more aspects of the present disclosure, the above and other objects and advantages may be accomplished by the provision of a light emitting display apparatus comprising a first anode electrode provided in a subpixel of a first pixel, a second anode electrode provided in a subpixel of a second pixel disposed adjacent to the first pixel, a first driving transistor for supplying power to the first pixel, a second driving transistor for supplying power to the second pixel, a welding contact portion for electrically connecting the second anode electrode to the first driving transistor when an error occurs in the second driving transistor, and a connection electrode including a connection electrode portion overlapped with the welding contact portion, a first protruding portion protruding from the connection electrode portion in a first direction, and a second protruding portion protruding from the connection electrode portion in a second direction.

In accordance with one or more aspects of the present disclosure, there is provided a light emitting display apparatus comprising a substrate, a subpixel including an emission area and a circuit area, a light emitting element provided in the light emission area on the substrate and configured to include an anode electrode, a light emitting layer, and a cathode electrode, a driving transistor provided in the circuit area on the substrate, a first connection electrode electrically connected to the driving transistor, a second connection electrode provided on a layer different from the first connection electrode and electrically connected to the driving transistor, and an organic insulating layer disposed on the first connection electrode and the second connection electrode and configured to include a first driving contact hole overlapped with at least a portion of the first connection electrode and a first welding contact hole overlapped with at least a portion of the second connection electrode, wherein the second connection electrode includes a connection electrode portion overlapped with the first welding contact hole, a first protruding portion protruding from the connection electrode portion in a first direction, and a second protruding portion protruding from the connection electrode portion in a second direction.

It is to be understood that both the foregoing description and the following description of the present disclosure are exemplary and explanatory, and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate aspects and embodiments of the disclosure, and together with the description serve to explain principles of the disclosure. In the drawings.

Figure 1:
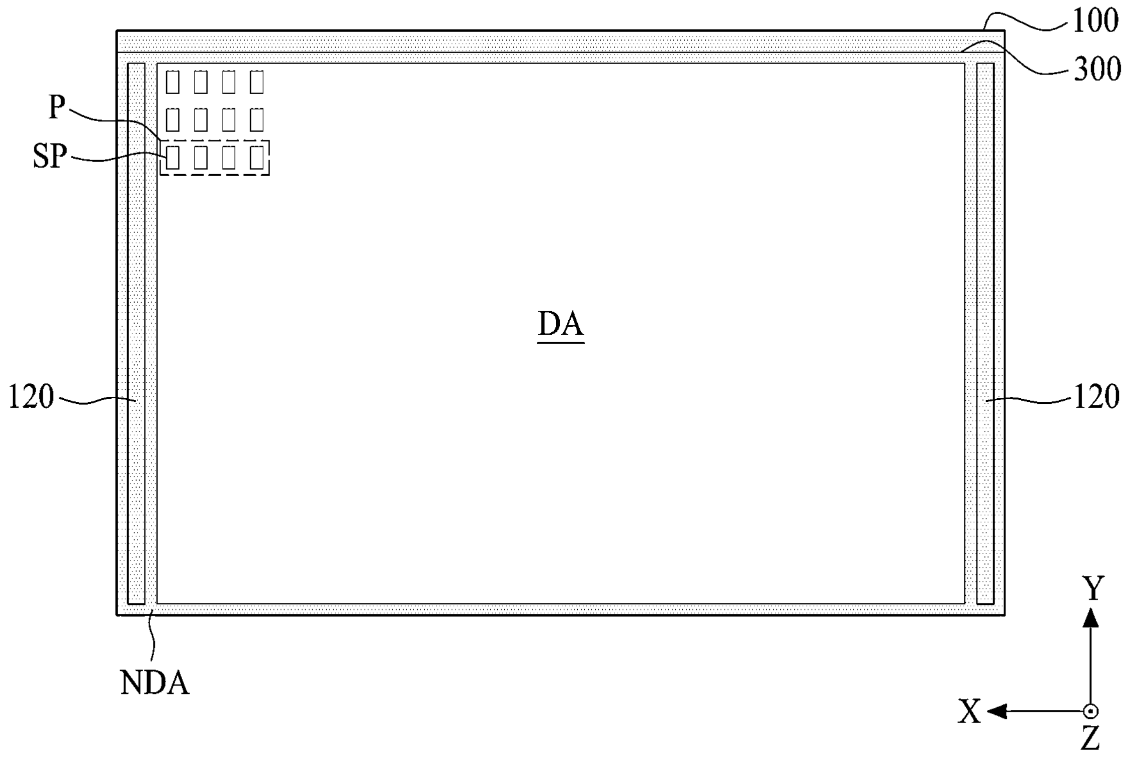
FIG. 1 is a plan view schematically illustrating a light emitting display apparatus according to an example embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and convenience.

DETAILED DESCRIPTION

Reference is now made in detail to embodiments of the present disclosure, examples of which may be illustrated in the accompanying drawings. In the following description, when a detailed description of well-known methods, functions, structures or configurations may unnecessarily obscure aspects of the present disclosure, the detailed description thereof may have been omitted for brevity. Further, repetitive descriptions may be omitted for brevity. The progression of processing steps and/or operations described is a non-limiting example.

The sequence of steps and/or operations is not limited to that set forth herein and may be changed to occur in an order that is different from an order described herein, with the exception of steps and/or operations necessarily occurring in a particular order. In one or more examples, two operations in succession may be performed substantially concurrently, or the two operations may be performed in a reverse order or in a different order depending on a function or operation involved.

Unless stated otherwise, like reference numerals may refer to like elements throughout even when they are shown in different drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through the embodiments described with reference to the accompanying drawings. The present disclosure may, however, be embodied in different forms and should not be construed as limited to the embodiments set forth herein. Rather, these embodiments are examples and are provided so that this disclosure may be thorough and complete to assist those skilled in the art to understand the inventive concepts without limiting the protected scope of the present disclosure.

Shapes, dimensions (e.g., sizes, lengths, widths, heights, thicknesses, locations, radii, diameters, and areas), ratios, angles, numbers, the number of elements, and the like disclosed herein, including those illustrated in the drawings, are merely examples, and thus, the present disclosure is not limited to the illustrated details. It is, however, noted that the relative dimensions of the components illustrated in the drawings are part of the present disclosure.

When the term "comprise," "have," "include," "contain," "constitute," "made of," "formed of," "composed of," or the like is used with respect to one or more elements, one or more other elements may be added unless a term such as "only" or the like is used. The terms used in the present disclosure are merely used in order to describe particular example embodiments, and are not intended to limit the scope of the present disclosure. The terms of a singular form may include plural forms unless the context clearly indicates otherwise. The word "exemplary" is used to mean serving as an example or illustration. Embodiments are example embodiments. Aspects are example aspects. "Embodiments," "examples," "aspects," and the like should not be construed to be preferred or advantageous over other implementations. An embodiment, an example, an example embodiment, an aspect, or the like may refer to one or more embodiments, one or more examples, one or more example embodiments, one or more aspects, or the like, unless stated otherwise. Further, the term "may" encompasses all the meanings of the term "can."

In one or more aspects, unless explicitly stated otherwise, an element, feature, or corresponding information (e.g., a level, range, dimension, size, or the like) is construed to include an error or tolerance range even where no explicit description of such an error or tolerance range is provided. An error or tolerance range may be caused by various factors (e.g., process factors, internal or external impact, noise, or the like). In interpreting a numerical value, the value is interpreted as including an error range unless explicitly stated otherwise.

In describing a positional relationship, where the positional relationship between two parts (e.g., layers, films, regions, components, sections, or the like) is described, for example, using "on," "upon," "on top of," "over," "under," "above," "below," "beneath," "near," "close to," "adjacent to," "beside," "next to," or the like, one or more other parts may be located between the two parts unless a more limiting term, such as "immediate(ly)," "direct(ly)," or "close(ly)," is used. For example, when a structure is described as being positioned "on," "on a top of," "upon," "on top of," "over," "under," "above," "below," "beneath," "near," "close to," "adjacent to," "beside," or "next to" another structure, this description should be construed as including a case in which the structures contact each other directly as well as a case in which one or more additional structures are disposed or interposed therebetween. Furthermore, the terms "front," "rear," "back," "left," "right," "top," "bottom," "downward," "upward," "upper," "lower," "up," "down," "column," "row," "vertical," "horizontal," and the like refer to an arbitrary frame of reference.

Spatially relative terms, such as "below," "beneath," "lower," "on," "above," "upper" and the like, can be used to describe a correlation between various elements (e.g., layers, films, regions, components, sections, or the like) as shown in the drawings. The spatially relative terms are to be understood as terms including different orientations of the elements in use or in operation in addition to the orientation depicted in the drawings. For example, if the elements shown in the drawings are turned over, elements described as "below" or "beneath" other elements would be oriented "above" other elements. Thus, the term "below," which is an example term, can include all directions of "above" and "below." Likewise, an exemplary term "above" or "on" can include both directions of "above" and "below."

In describing a temporal relationship, when the temporal order is described as, for example, "after," "subsequent," "next," "before," "preceding," "prior to," or the like, a case that is not consecutive or not sequential may be included and thus another event may occur therebetween, unless a more limiting term, such as "just," "immediate(ly)," or "direct(ly)," is used.

It is understood that, although the terms "first," "second," and the like may be used herein to describe various elements (e.g., layers, films, regions, components, sections, or the like), these elements should not be limited by these terms. These terms are used only to distinguish one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure. For clarity, the functions or structures of these elements (e.g., the first element, the second element, and the like) are not limited by ordinal numbers or the names in front of the elements.

In describing elements of the present disclosure, the terms "first," "second," "A," "B," "(a)," "(b)," or the like may be used. These terms are intended to identify the corresponding element(s) from the other element(s), and these are not used to define the essence, basis, order, or number of the elements.

For the expression that an element (e.g., layer, film, region, component, section, or the like) is "connected," "coupled," "attached," or "adhered" to another element, the element can not only be directly connected, coupled, attached, or adhered to another element, but also be indirectly connected, coupled, attached, or adhered to another element with one or more intervening elements disposed or interposed between the elements, unless otherwise specified.

For the expression that an element (e.g., layer, film, region, component, section, or the like) "contacts," "overlaps," or the like with another element, the element can not only directly contact, overlap, or the like with another element, but also indirectly contact, overlap, or the like with another element with one or more intervening elements disposed or interposed between the elements, unless otherwise specified.

The terms "first direction," "second direction," and the like should not be interpreted only based on a geometrical relationship in which the respective directions are perpendicular to each other, and may be meant as directions having wider directivities within the range within which the components of the present disclosure can operate functionally.

The term "at least one" should be understood as including any and all combinations of one or more of the associated listed items. For example, each of the phrases "at least one of a first item, a second item, or a third item" and "at least one of a first item, a second item, and a third item" denotes the combination of items proposed from two or more of the first item, the second item, and the third item as well as only one of the first item, the second item, or the third item.

The expression of a first element, a second elements "and/or" a third element should be understood as one of the first, second and third elements or as any or all combinations of the first, second and third elements. By way of example, A, B and/or C may refer to only A; only B; only C; any of A, B, and C (e.g., A, B, or C); some combination of A, B, and C (e.g., A and B; A and C; or B and C); or all of A, B, and C. Furthermore, an expression "A/B" may be understood as A and/or B. For example, an expression "A/B" may refer to only A; only B; A or B; or A and B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two. Furthermore, when an element (e.g., layer, film, region, component, sections, or the like) is referred to as being "between" at least two elements, the element may be the only element between the at least two elements, or one or more intervening elements may also be present.

In one or more aspects, the phrases "each other" and "one another" may be used interchangeably simply for convenience unless stated otherwise. In one or more examples, the number of elements involved in the foregoing expression may be two. In one or more examples, the number of elements involved in the foregoing expression may be more than two.

In one or more aspects, the phrases "one or more among" and "one or more of" may be used interchangeably simply for convenience unless stated otherwise. In one or more aspects, unless stated otherwise, the term "nth" may refer to "nnd" (e.g., 2nd where n is 2), or "nrd" (e.g., 3rd where n is 3), and n may be a natural number.

The term "or" means "inclusive or" rather than "exclusive or." That is, unless otherwise stated or clear from the context, the expression that "x uses a or b" means any one of natural inclusive permutations. For example, "a or b" may mean "a," "b," or "a and b." For example, "a, b or c" may mean "a," "b," "c," "a and b," "b and c," "a and c," or "a, b and c."

The phase that a first element is "provided in" a second element may be understood as that at least a portion of the first element is provided in the second element or that the entirety of the first element is provided in the second element. The phase that a first element "overlaps" a second element may be understood as that at least a portion of the first element overlaps a least a portion of the second element, that the entirety of the first element overlaps with a least a portion of the second element, or that at least a portion of the first element overlaps with the entirety of the second element.

Features of various embodiments of the present disclosure may be partially or entirely coupled to or combined with each other, may be technically associated with each other, and may be variously operated, linked or driven together.

The embodiments of the present disclosure may be implemented or carried out independently of each other or may be implemented or carried out together in a co-dependent or related relationship. In one or more aspects, the components of each apparatus according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

The terms used herein have been selected as being general in the related technical field; however, there may be other terms depending on the development and/or change of technology, convention, preference of technicians, and so on. Therefore, the terms used herein should not be understood as limiting technical ideas, but should be understood as examples of the terms for describing example embodiments.

Further, in a specific case, a term may be arbitrarily selected by an applicant, and in this case, the detailed meaning thereof is described herein. Therefore, the terms used herein should be understood based on not only the name of the terms, but also the meaning of the terms and the content hereof.

In the following description, various example embodiments of the present disclosure are described in detail with reference to the accompanying drawings. With respect to reference numerals to elements of each of the drawings, the same elements may be illustrated in other drawings, and like reference numerals may refer to like elements unless stated otherwise. The same or similar elements may be denoted by the same reference numerals even though they are depicted in different drawings. In addition, for convenience of description, a scale, dimension, size, and thickness of each of the elements illustrated in the accompanying drawings may be different from an actual scale, dimension, size, and thickness, and thus, embodiments of the present disclosure are not limited to a scale, dimension, size, and thickness illustrated in the drawings.

FIG. 1 is a plan view schematically illustrating a light emitting display apparatus according to an example embodiment of the present disclosure.

Referring to FIG. 1, the light emitting display apparatus according to an example embodiment of the present disclosure includes a first substrate 100, a plurality of pixels P and a second substrate 300.

The first substrate 100 is a thin film transistor array substrate, and may include glass or a plastic material. The light emitting display apparatus may include a display area DA and a non-display area NDA, and the first substrate 100 may be divided into the display area DA and the non-display area NDA.

The display area DA is an area in which a plurality of pixels P are provided to display an image, and may correspond to the other area except for an edge area of the first substrate 100.

A plurality of pixels P may be provided in the display area DA, and may be defined as a unit area in which light is actually emitted. Each of the plurality of pixels P may include a plurality of subpixels SP. For example, each of the plurality of pixels P may include a red subpixel that emits red light, a green subpixel that emits green light, and a blue subpixel that emits blue light, but the present disclosure is not limited thereto. As another example, each of the plurality of pixels P may include a white subpixel that emits white light. Sizes of the plurality of subpixels included in each of the plurality of pixels P may be the same as or different from each other.

The non-display area NDA is an area in which an image is not displayed, and may correspond to an area excluding the display area DA. The non-display area NDA is an edge area of the first substrate 100 surrounding the display area DA, may have a relatively very narrow width, and may be defined as a bezel area. The non-display area NDA may be provided with a peripheral circuit 120 that includes a line and a circuit to drive the plurality of pixels P provided in the display area DA.

The peripheral circuit 120 may include a gate driving circuit connected to the plurality of pixels P. The gate driving circuit may be integrated in the non-display area NDA at one side or both sides of the first substrate 100 and connected to the plurality of pixels P in accordance with a manufacturing process of a thin film transistor. The gate driving circuit may be formed by a gate driver in panel (GIP) method, a gate driver in active area (GIA) method or a tape automated bonding (TAB) method.

The second substrate 300 may protect a pixel array provided on the first substrate 100. The second substrate 300 may be defined as an opposing substrate, an encapsulation substrate or a color filter array substrate, and may be bonded to the first substrate 100 through an adhesive member (or a transparent adhesive). The second substrate 300 may include a transparent glass material or a transparent plastic material, but is not limited thereto. The second substrate 300 may be omitted if necessary.

Figure 2:
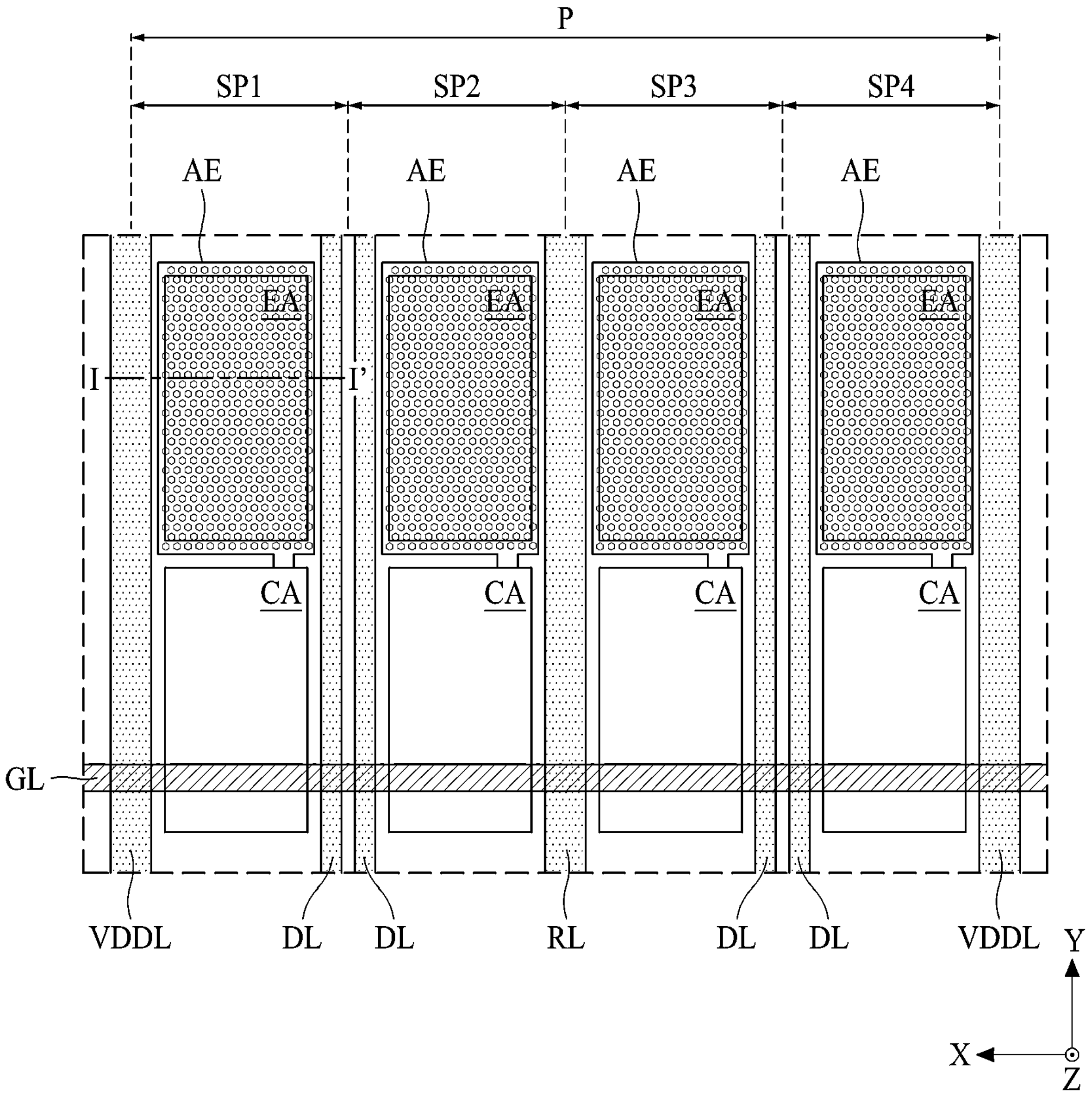
FIG. 2 is an example plan view schematically illustrating a pixel included in a display area.
Figure 3:
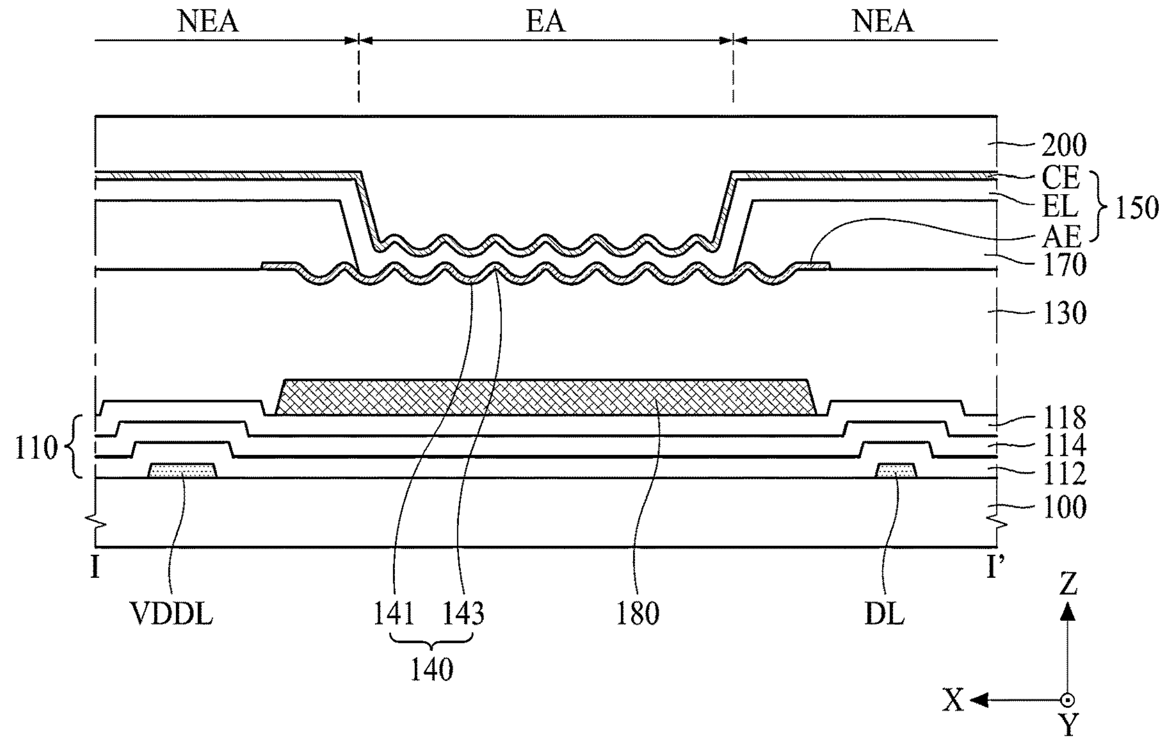
FIG. 3 is an example cross-sectional view along I-I' of an emission area of FIG. 2.
Figure 4:
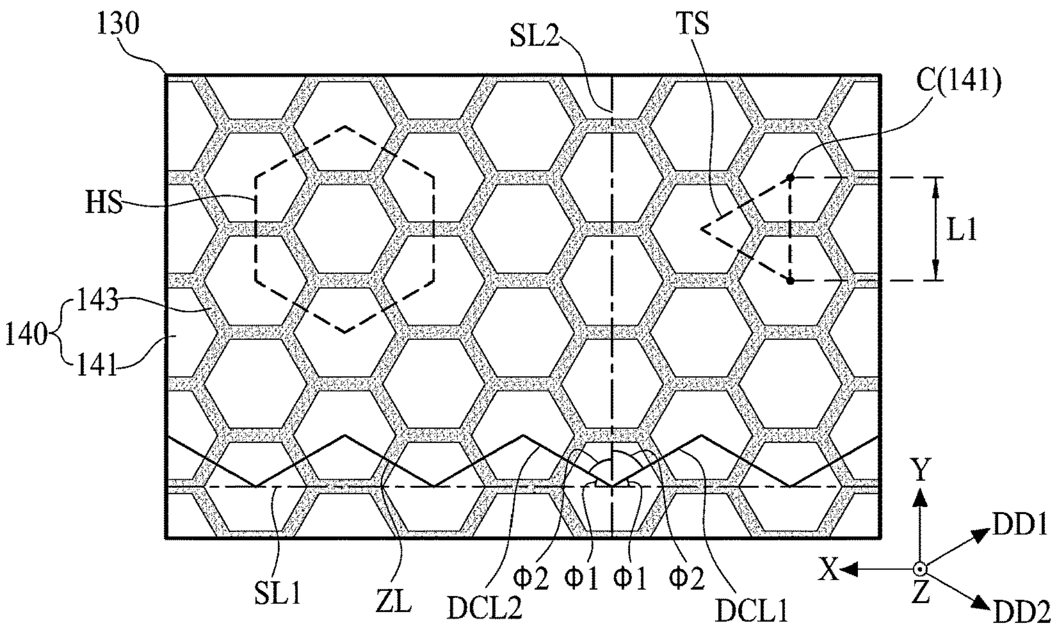
FIG. 4 is an example plan view illustrating a portion of a light extraction unit shown in FIG. 3.

FIG. 2 is an example plan view schematically illustrating a pixel included in a display area. FIG. 3 is an example cross-sectional view along I-I' of an emission area of FIG. 2. FIG. 4 is an example plan view illustrating some of a light extraction unit shown in FIG. 3.

Referring to FIGS. 1 and 2, the light emitting display apparatus according to an example embodiment of the present disclosure includes a plurality of pixels P in a display area DA, and each of the plurality of pixels P may include a plurality of subpixels SP. In an example embodiment, each of the plurality of pixels P may include four subpixels SP1 to SP4. For example, each of the plurality of pixels P may include a first subpixel SP1 emitting red light, a second subpixel SP2 emitting green light, a third subpixel SP3 emitting blue light and a fourth subpixel SP4 emitting white light, but the present disclosure is not limited thereto.

Each of the first to fourth subpixels SP1 to SP4 may include a light emission area EA and a circuit area CA. The light emission area EA may be sometimes referred to as an emission area. The light emission area EA may be disposed at one side (or an upper side) of a subpixel area, and the circuit area CA may be disposed at the other side (or a lower side) of the subpixel area. For example, the circuit area CA may be disposed below the light emission area EA based on a second direction (e.g., Y-axis direction). The light emission areas EA of the first to fourth subpixels SP1 to SP4 may have the same size, but are not limited thereto. The light emission areas EA of the first to fourth subpixels SP1 to SP4 may have a different size (or area).

The circuit area CA may be spatially separated from the light emission area EA in the subpixel area, but the present disclosure is not limited thereto. For example, at least a portion of the circuit area CA may overlap the light emission area EA in the subpixel area, or may be disposed below the light emission area EA. The light emission area EA may be an opening area, a light emission area, a transmissive area or a transmissive portion. The circuit area CA may be a non-emission area NEA or a non-opening area.

Each of the first to fourth subpixels SP1 to SP4 according to an example embodiment may further include a transparent area that is disposed near at least one of the light emission area EA or the circuit area CA and transmits external light. In this case, the light emitting display apparatus may implement a transparent light emitting display apparatus due to light transmission of the transparent portion.

Each of the first to fourth subpixels SP1 to SP4 may include a light extraction unit 140 (e.g., light extraction part) and a light emitting element 150 in the light emission area EA as shown in FIG. 3.

Referring to FIG. 3, an overcoat layer 130 may be provided over the first substrate 100 provided with a pixel circuit layer 110. The overcoat layer 130 may be provided over the first substrate 100 to cover the pixel circuit layer 110. The overcoat layer 130 may be provided in the other area of the non-display area NDA except for the pad area and the entire display area DA. For example, the overcoat layer 130 may include an extension portion (or an enlarged portion) extended or enlarged toward the other non-display area except for the pad area from the display area DA. Therefore, the overcoat layer 130 may have a relatively wider size than the display area DA.

The overcoat layer 130 may be formed to have a relatively thick thickness to provide a flat surface on the pixel circuit layer 110 (e.g., to provide a planarization function). For example, the overcoat layer 130 may include an organic insulating layer, for example, an organic material such as photo acryl, benzocyclobutene, polyimide and/or fluorine resin.

The light extraction unit 140 may be provided over an upper surface of the overcoat layer 130 to overlap the light emission area EA of the subpixel SP. The light extraction unit 140 can also be referred to as a light extraction part and is configured to direct more light outside of the device. The light extraction unit 140 may be provided over the overcoat layer 130 to have a curved (or uneven) shape, thereby changing a propagation path of light emitted from the light emitting element 150 to increase light extraction efficiency. For example, the light extraction unit 140 may be a non-flat portion, an uneven pattern portion, a micro lens portion, or a light scattering pattern portion.

The light extraction unit 140 may include a plurality of concave portions 141 and a convex portion 143 disposed near each of the plurality of concave portions 141, which can form a honeycomb pattern in a plan view, but embodiments are not limited thereto. The plurality of concave portions 141 may be formed or configured to be concave from the upper surface of the overcoat layer 130. The convex portion 143 may be disposed between the plurality of concave portions 141. The convex portion 143 may be formed to surround each of the plurality of concave portions 141.

An upper portion of the convex portion 143 may include a pointed tip structure to increase light extraction efficiency, but is not limited thereto. For example, the upper portion of the convex portion 143 may have a convex curved shape. For example, the upper portion of the convex portion 143 may include a convex cross-sectional dome or bell structure, but the present disclosure is not limited thereto.

The convex portion 143 may include an inclined portion having a curved shape between a bottom portion and an upper portion (or a top portion). The inclined portion of the convex portion 143 may form or configure the concave portion 141. For example, the inclined portion of the convex portion 143 may be an inclined surface or a curved surface. The inclined portion of the convex portion 143 according to an example embodiment may have a cross-sectional structure of a Gaussian curve. In this case, the inclined portion of the convex portion 143 may have a tangent slope that gradually increases from the bottom portion to the upper portion and is gradually reduced.

Referring to FIG. 4, each of the plurality of concave portions 141 according to an example embodiment of the present disclosure may be disposed in parallel to have a predetermined interval along a first direction (e.g., X-axis direction), and may be alternately disposed along the second direction (e.g., Y-axis direction). Therefore, the light extraction unit 140 (e.g., light extraction part) may include a larger number of concave portions 141 per unit area, thereby increasing external extraction efficiency of light emitted from the light emitting element 150.

According to an example embodiment, a central portion C of each of the plurality of concave portions 141 disposed along the first direction (e.g., X-axis direction) may be positioned or aligned in a first straight line SL1 parallel to the first direction (e.g., X-axis direction). The central portion C of each of the plurality of concave portions 141 disposed along the second direction (e.g., Y-axis direction) may be positioned or aligned in a second straight line SL2 parallel to the second direction (e.g., Y-axis direction).

According to another example embodiment, the plurality of concave portions 141 may be disposed in a lattice shape. Each of the plurality of concave portions 141 disposed in an even-numbered horizontal line parallel to the first direction (e.g., X-axis direction) may be disposed between the plurality of concave portions 141 disposed in adjacent odd-numbered horizontal lines along the second direction (e.g., Y-axis direction). Therefore, the plurality of concave portions 141 may be positioned or aligned in a zigzag line ZL having a zigzag shape along the first direction (e.g., X-axis direction).

According to an example embodiment, the central portion C of each of three adjacent concave portions 141 may form a triangular shape TS. In addition, the central portion C of each of six concave portions 141 disposed near one concave portion 141 or surrounding one concave portion 141 may form a six-angular shape HS in a plan view (e.g., a hexagon shape). For example, each of the plurality of concave portions 141 may be disposed or arranged in a honeycomb structure or a circle structure, but embodiments are not limited thereto.

According to an example embodiment of the present disclosure, when the plurality of concave portions 141 are disposed in a honeycomb structure, diagonal center lines DCL1 and DCL2 passing through the central portion C of concave portions 141 disposed along diagonal directions DD1 and DD2 between the first direction (e.g., X-axis direction) and the second direction (e.g., Y-axis direction) may be inclined from each of the first straight line SL1 and the second straight line SL2. For example, a first angle Φ1 between the diagonal center lines DCL1 and DCL2 and the first straight line SL1 may be 30°, and a second angle Φ2 between the diagonal center lines DCL1 and DCL2 and the second straight line SL2 may be 60°.

According to an example embodiment of the present disclosure, pitches (or interval L1) between the concave portions 141 respectively disposed in the plurality of subpixels SP constituting one pixel P may be the same as or different from each other. The pitch L1 between the concave portions 141 may be a distance (or interval) between the central portions C of two adjacent concave portions 141.

In an example embodiment, the pitches L1 among the concave portions 141 respectively disposed in the red subpixel, the green subpixel, the blue subpixel and the white subpixel may be the same as or different from one another. For example, the pitch L1 between the concave portions 141 disposed in the green subpixel may be different from that between the concave portions 141 disposed in the blue subpixel.

In another example embodiment, the concave portions 141 respectively disposed in the red subpixel, the green subpixel, the blue subpixel and the white subpixel may have the same number and/or density or different numbers and/or densities from one another. For example, the number and/or density of the concave portions 141 disposed in each of the white subpixel and the green subpixel may be different from the number and/or density of the concave portions 141 disposed in each of the red subpixel and the blue subpixel.

The convex portion 143 may be configured to individually surround each of the plurality of concave portions 141. Therefore, the light extraction unit 140 may include a plurality of concave portions 141 surrounded by the convex portion 143. The convex portion 143 surrounding one concave portion 141 may have a hexagonal shape (or a honeycomb shape) in a plan view, but the embodiment of the present disclosure is not limited thereto.

Referring back to FIG. 3, the light emitting element 150 may be disposed over the light extraction unit 140 (e.g., light extraction part) that overlaps with the light emission area EA. The light emitting element 150 may be configured to emit light toward the first substrate 100 in accordance with a bottom emission method, but the embodiment of the present disclosure is not limited thereto. The light emitting element 150 according to an example embodiment may include an anode electrode AE, a light emitting layer EL and a cathode electrode CE.

The anode electrode AE may be provided over the overcoat layer 130 and electrically connected to a source electrode (or a drain electrode) of a driving thin film transistor. The anode electrode AE may be extended from the light emission area EA to the circuit area CA. One end of the anode electrode AE may be electrically connected to the source electrode (or the drain electrode) of the driving thin film transistor through a driving contact hole in the circuit area CA.

Since the anode electrode AE is directly in contact with the light extraction unit 140, the anode electrode AE may have a shape that follows the shape of the light extraction unit 140. Since the anode electrode AE is provided (or deposited) over the overcoat layer 130 to have a relatively thin thickness, the anode electrode AE may have a surface shape that conforms to a surface morphology of the light extraction unit 140 that includes the convex portion 143 and the plurality of concave portions 141. For example, the anode electrode AE may have the same cross-sectional structure as that of the light extraction unit 140 as the anode electrode AE is formed in a conformal shape, which follows the surface shape (or morphology) of the light extraction unit 140, by a deposition process of a transparent conductive material.

The light emitting layer EL may be provided over the anode electrode AE and may be directly in contact with the anode electrode AE. The light emitting layer EL may be formed (or deposited) on the anode electrode AE so as to have a relatively thick thickness as compared with the anode electrode AE, thereby having a surface shape different from that of each of the plurality of concave portions 141 and the convex portion 143 or that of the anode electrode AE. For example, the light emitting layer EL may be formed in a non-conformal shape, which does not follow the surface shape (or morphology) of the anode electrode AE, by a deposition process and thus may have a cross-sectional structure different from that of the anode electrode AE.

The light emitting layer EL according to an example embodiment may have a thickness that is gradually increased toward the bottom surface of the convex portion 143 or the concave portion 141. For example, the light emitting layer EL may be formed on the top of the convex portion 143 to have a first thickness, may be formed on the bottom surface of the concave portion 141 to have a second thickness thicker than the first thickness, and may be formed on the inclined surface (or the curved portion) of the convex portion 143 to have a third thickness thinner than the first thickness. Each of the first to third thicknesses may correspond to a shortest distance between the anode electrode AE and the cathode electrode CE.

The light emitting layer EL according to an example embodiment may include two or more organic light emitting layers for emitting white light. For example, the light emitting layer EL may include first and second organic light emitting layers for emitting white light by mixing first light with second light. For example, the first organic light emitting layer may include one of a blue organic light emitting layer, a green organic light emitting layer, a red organic light emitting layer, a yellow organic light emitting layer and a yellow-green organic light emitting layer to emit the first light. For example, the second organic light emitting layer may include an organic light emitting layer for emitting the second light for implementing white light by mixture with the first light of the blue organic light emitting layer, the green organic light emitting layer, the red organic light emitting layer, the yellow organic light emitting layer and the yellow-green organic light emitting layer. The light emitting layer EL according to another example embodiment may include any one of the blue organic light emitting layer, the green organic light emitting layer and the red organic light emitting layer. Additionally, the light emitting layer EL may include a charge generation layer interposed between the first organic light emitting layer and the second organic light emitting layer.

The cathode electrode CE may be provided over the light emitting layer EL and may be directly in contact with the light emitting layer EL. The cathode electrode CE may be formed (or deposited) on the light emitting layer EL to have a relatively thin thickness as compared with the light emitting layer EL. The cathode electrode CE may be formed (or deposited) on the light emitting layer EL to have a relatively thin thickness, thereby having a surface shape that conforms to that of the light emitting layer EL. For example, the cathode electrode CE may be formed in a conformal shape that conforms to the surface shape (or morphology) of the light emitting layer EL by a deposition process to have a cross-sectional structure the same as that of the light emitting layer EL and different from that of the light extraction unit 140.

The cathode electrode CE according to an example embodiment may include a metal material having high reflectance to reflect incident light, which is emitted from the light emitting layer EL, toward the first substrate 100. For example, the cathode electrode CE may include a single layered structure or multi-layered structure made of any one material selected from aluminum (Al), silver (Ag), molybdenum (Mo), gold (Au), magnesium (Mg), calcium (Ca) and barium (Ba), or two or more alloy materials. The cathode electrode CE may include an opaque conductive material having high reflectance.

The light emitting element 150 may emit light by a current supplied by the pixel circuit. The concave portion 141 or the convex portion 143 of the light extraction unit 140 (e.g., light extraction part) increases external extraction efficiency of the light emitted from the light emitting layer EL by changing a path of the light emitted from the light emitting layer EL to a light emitting surface (or light extraction surface). For example, the convex portion 143 may prevent or minimize degradation of light extraction efficiency due to light trapped in the light emitting element 150 by repeating total reflection between the anode electrode AE and the cathode electrode CE of the light emitting element 150 without moving the light emitted from the light emitting element 150 to the light emitting surface. Therefore, the light emitting display apparatus according to an example embodiment of the present disclosure may improve light extraction efficiency of the light emitted from the light emitting element 150.

The light emitting display apparatus according to an example embodiment of the present disclosure may further include a bank 170. The bank 170 may be provided over the overcoat layer 130. The bank 170 may include an organic material such as a benzocyclobutene (BCB)-based resin, an acryl-based resin or a polyimide resin.

The bank 170 may be provided over the overcoat layer 130 to at least partially cover an edge of the anode electrode AE extended onto the circuit area CA. The light emission area EA defined by the bank 170 may have a size smaller than that of the light extraction unit 140 in a plan view.

The light emitting layer EL of the light emitting element 150 may be provided over the anode electrode AE, the bank 170 and a step difference portion between the anode electrode AE and the bank 170. In this case, when the light emitting layer EL is formed in the step difference portion between the anode electrode AE and the bank layer 170 to have a relatively thin thickness, the cathode electrode CE may be in electrical contact (or short) with the anode electrode AE. To solve this problem, an end (or outermost bank line) of the bank 170 adjacent to the light emission area EA may be disposed to cover an edge portion of the light extraction unit 140. Therefore, an electrical contact (or short) between the anode electrode AE and the cathode electrode CE may be prevented from occurring due to an end of the bank 170 disposed in the step difference portion between the anode electrode AE and the bank 170.

The light emitting display apparatus according to an example embodiment of the present disclosure may further include a color filter 180.

The color filter 180 may be disposed between the first substrate 100 and the overcoat layer 130 to at least partially overlap at least one light emission area EA. The color filter 180 according to an example embodiment may be disposed below the overcoat layer 130 and at least partially overlap the light emission area EA.

The color filter 180 may have a size larger than that of the light emission area EA. For example, the color filter 180 may have a size larger than that of the light emission area EA and smaller than that of the light extraction unit 140 (e.g., light extraction part), but the present disclosure is not limited thereto. The color filter 180 may have a size larger than that of the light extraction unit 140. For example, when the color filter 180 has a size larger than that of the light extraction unit 140, light leakage, in which internal light moves toward the subpixel SP adjacent thereto, may be reduced or minimized.

The color filter 180 according to an example embodiment may include a color filter that transmits only a wavelength of a color, which is set in the subpixel SP among light emitted (or extracted) from the light emitting element 150 to the first substrate 100. For example, the color filter 180 may transmit a red, green or blue wavelength. When one pixel P includes first to fourth subpixels SP adjacent to one another, a color filter provided in the first subpixel may include a red color filter, a color filter provided in the second subpixel may include a green color filter, and a color filter provided in the third subpixel may include a blue color filter. The fourth subpixel may not include a color filter, or may include a transparent material for compensation of a step difference, thereby emitting white light.

The light emitting display apparatus according to an example embodiment of the present disclosure may further include an encapsulation layer 200.

The encapsulation layer 200 may be provided over the first substrate 100 to cover the light emitting element 150. The encapsulation layer 200 may be provided over the first substrate 100 to cover the cathode electrode AE. The encapsulation layer 200 may serve to protect the thin film transistor and the light emitting layer EL from external impact and prevent oxygen and/or moisture or particles from being permeated into the cathode electrode CE and the light emitting layer EL.

The encapsulation layer 200 according to an example embodiment may include at least one inorganic encapsulation layer and at least one organic encapsulation layer. The organic encapsulation layer may be expressed as a particle cover layer.

The encapsulation layer 200 according to another example embodiment may be changed to a filler fully surrounding the display area, and in this case, the second substrate 300 may be bonded to the first substrate 100 via a filler. The filler may include a getter material that absorbs oxygen and/or moisture.

The second substrate 300 may be coupled to the encapsulation layer 200. The second substrate 300 may include a plastic material, a glass material or a metal material. For example, when the encapsulation layer 200 includes a plurality of inorganic encapsulation layers, the second substrate 300 may be omitted.

Optionally, when the encapsulation layer 200 is changed to the filler, the second substrate 300 may be coupled to the filler, and in this case, the second substrate 300 may be made of a plastic material, a glass material or a metal material.

Referring back to FIG. 2, the first to fourth subpixels SP1 to SP4 may be disposed to be adjacent to one another along the first direction (e.g., X-axis direction). Two data lines DL extended along the second direction (e.g., Y-axis direction) may be disposed between the first subpixel SP1 and the second subpixel SP2 and between the third subpixel SP3 and the fourth subpixel SP4 in parallel to each other. A pixel power line VDDL extended along the second direction (e.g., Y-axis direction) may be disposed at one side of the first subpixel SP1 or the fourth subpixel SP4. A reference line RL extended along the second direction (e.g., Y-axis direction) may be disposed between the second subpixel SP2 and the third subpixel SP3. The reference line RL may be used as a sensing line for sensing a characteristic change of the driving thin film transistor disposed in the circuit area CA and/or a characteristic change of the light emitting element from the outside during a sensing driving mode of the pixel P. A gate line GL extended along the first direction X may be disposed below the circuit area CA of each of the first to fourth subpixels SP1 to SP4.

Each of the first to fourth subpixels SP1 to SP4 may include a pixel circuit in the circuit area CA. The pixel circuit may be connected to the gate line GL, the data line DL and the pixel power line VDDL, which are provided to be adjacent to the circuit area CA. The pixel circuit controls a current flowing in the light emitting element 150 in accordance with a data signal from the data line DL in response to a scan pulse from the gate line GL based on a pixel power source supplied from the pixel power line VDDL. The pixel circuit may include at least one transistor and a capacitor.

The at least one transistor may include a driving transistor and switching transistors. The switching transistor may be switched in accordance with the scan pulse supplied to the gate line GL to charge a data voltage, which is supplied from the data line DL, in the capacitor.

The driving transistor may be switched in accordance with a voltage supplied from the switching transistor or the data voltage charged in the capacitor to generate a data current from the power source supplied from the pixel power line VDDL and supply the data current to the light emitting element 150 of the first to fourth subpixels SP1 to SP4.

In the light emitting display apparatus according to an example embodiment of the present disclosure, in addition to at least one transistor and the capacitor, contact portions for electrically connecting the light emitting element 150 to the driving transistor may be further disposed in the circuit area CA. A size of the circuit area CA may be increased in accordance with positions of the driving transistor and the contact portions, whereby the size of the light emission area EA may be reduced.

The light emitting display apparatus according to an example embodiment of the present disclosure may include a driving transistor and contact portions, which are capable of minimizing the size of the circuit area CA.

Hereinafter, the driving transistor and the plurality of contact portions, which are provided in the circuit area CA, are described in detail with reference to FIGS. 5A to 12.

Figure 5A:
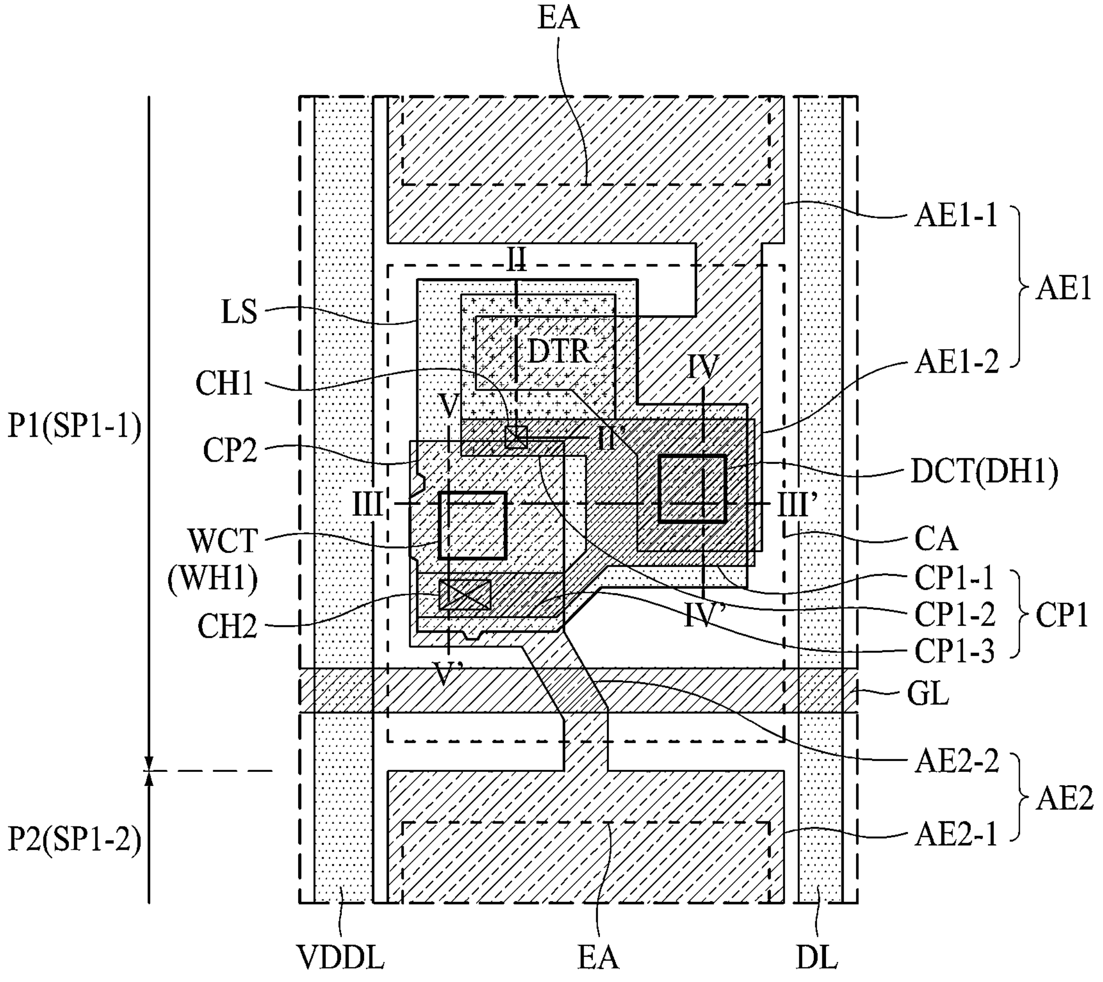
FIG. 5A is an example plan view illustrating a driving transistor and contact portions provided in a circuit area of FIG. 2.
Figure 5B:
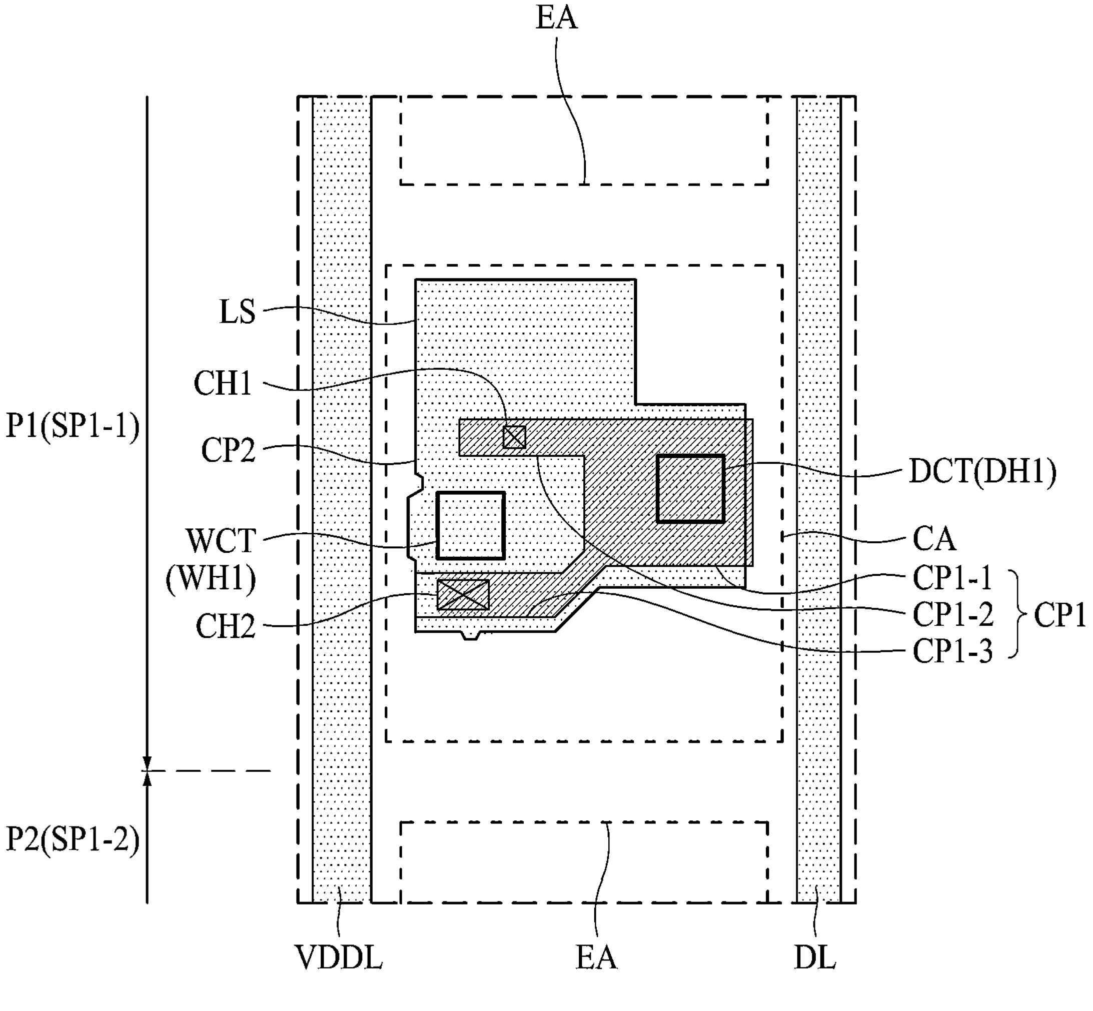
FIGS. 5B to 5D are example plan views illustrating some of the components shown in FIG. 5A.
Figure 5C:
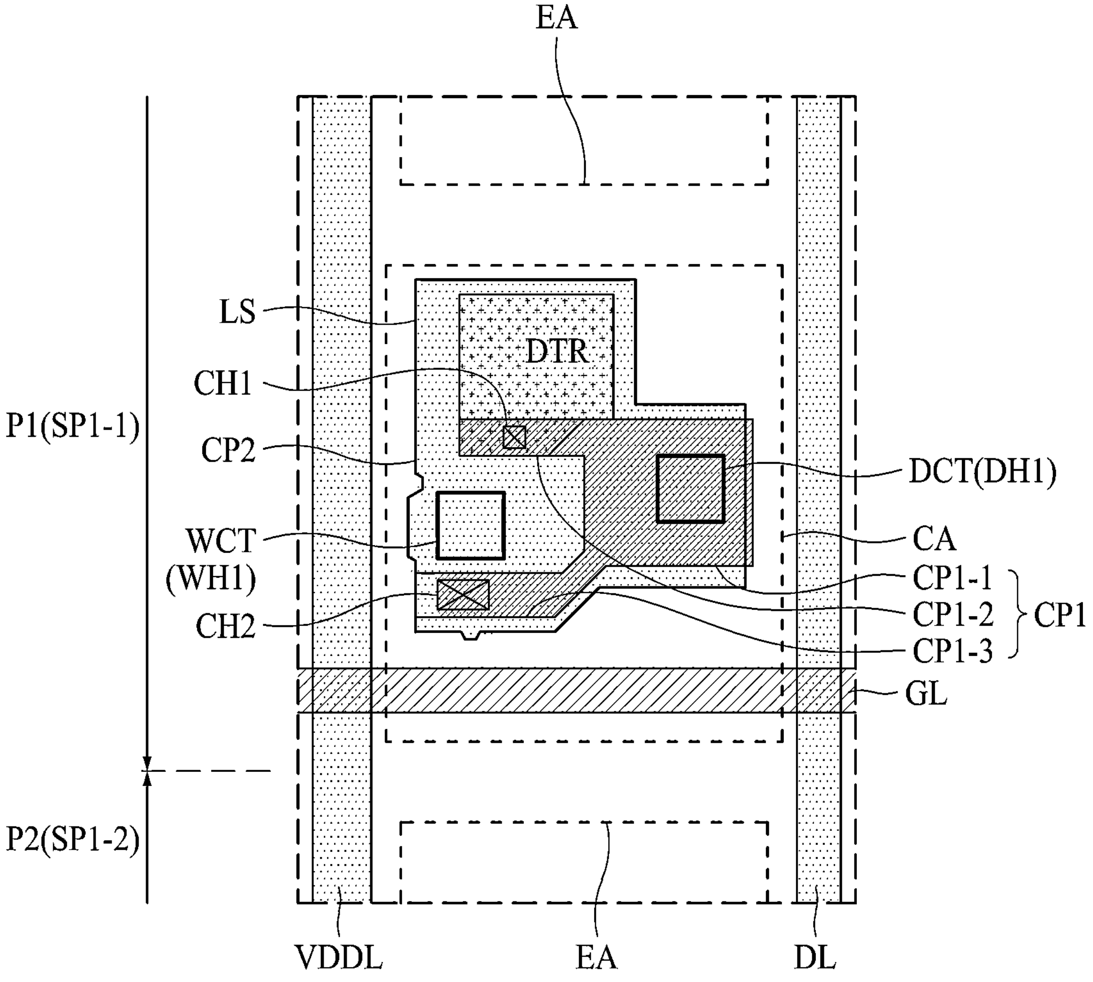
Figure 5D:
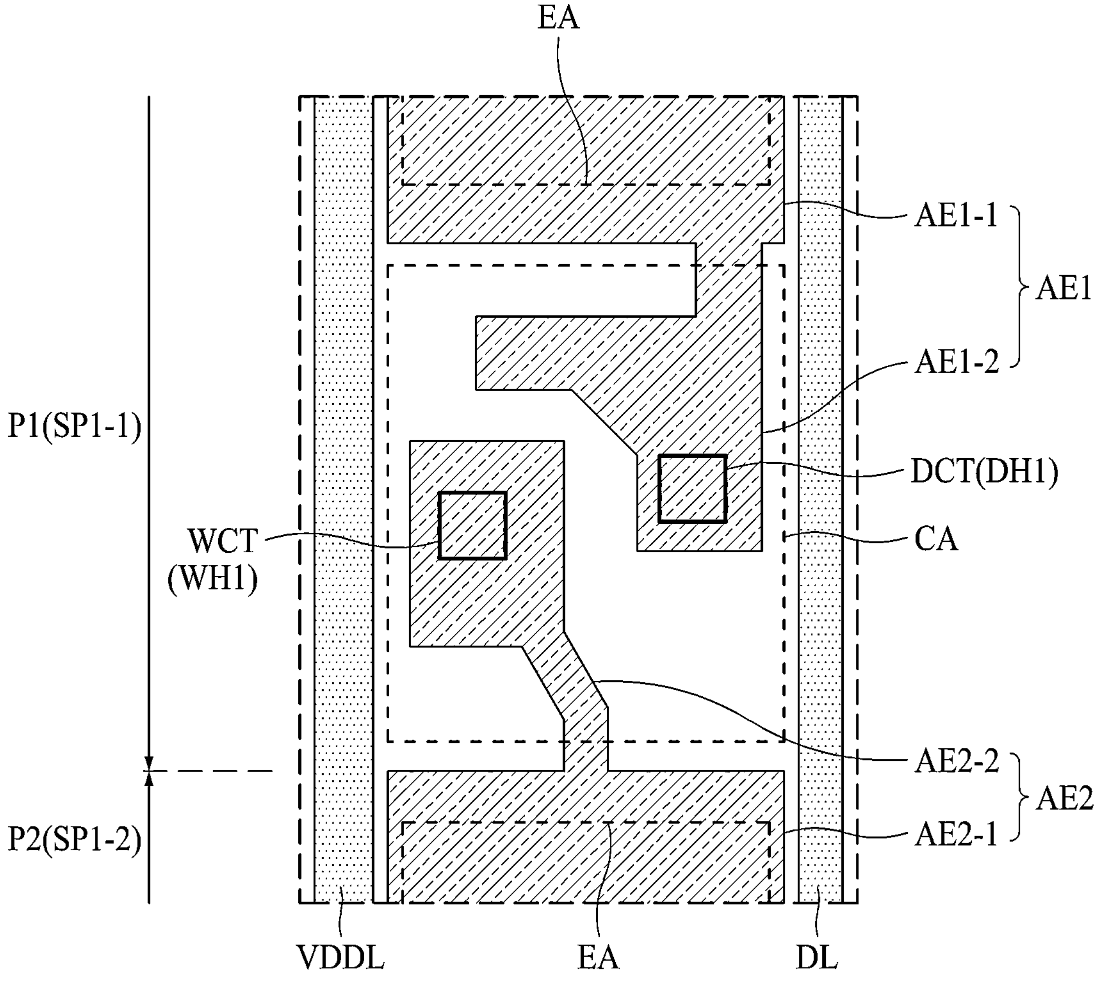
Figure 6:
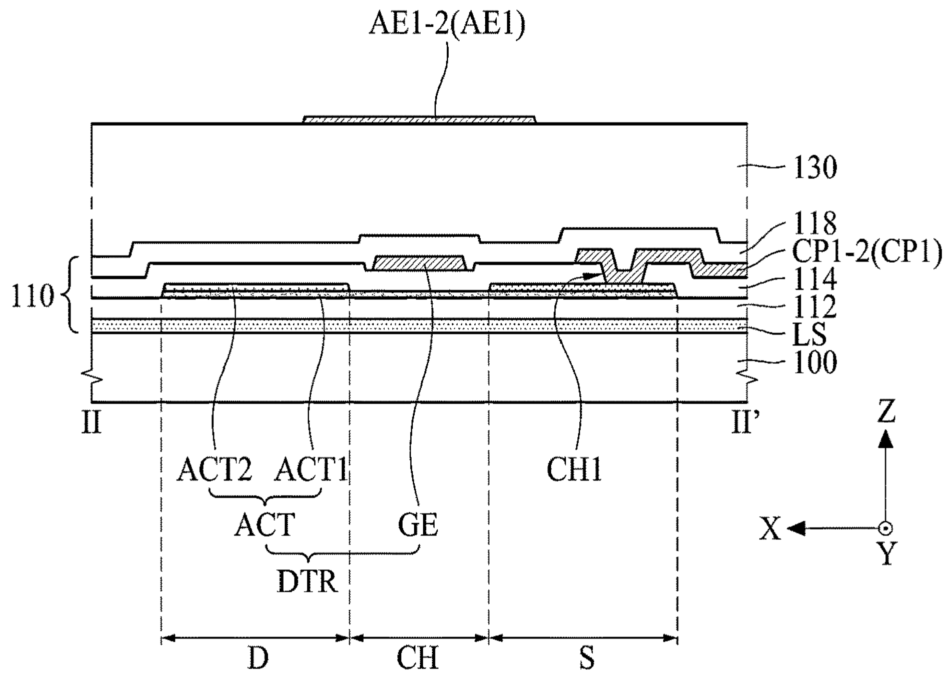
FIG. 6 is an example cross-sectional view along II-II' of a driving transistor of FIG. 5A.
Figure 7:
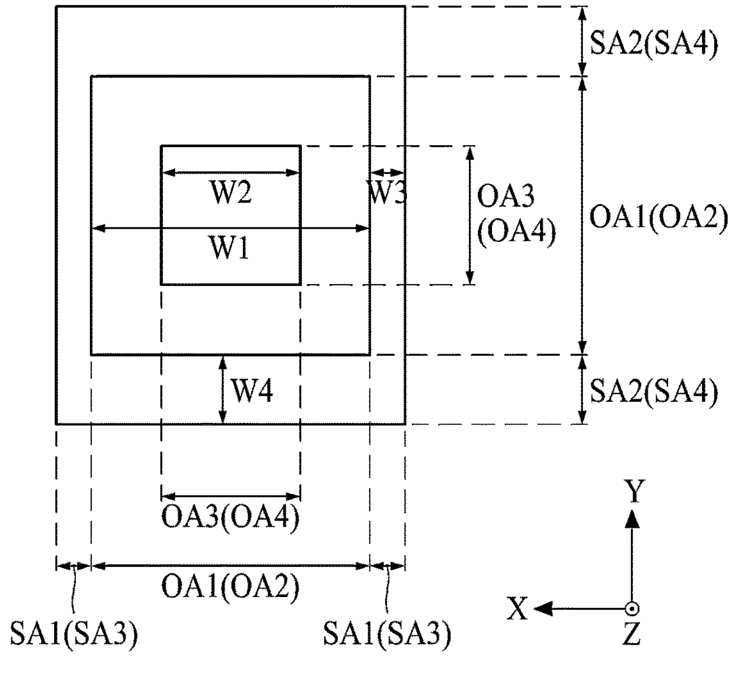
FIG. 7 is an example plan view illustrating an opening area of holes provided in a driving contact portion and a welding contact portion shown in FIG. 5A.
Figure 8:
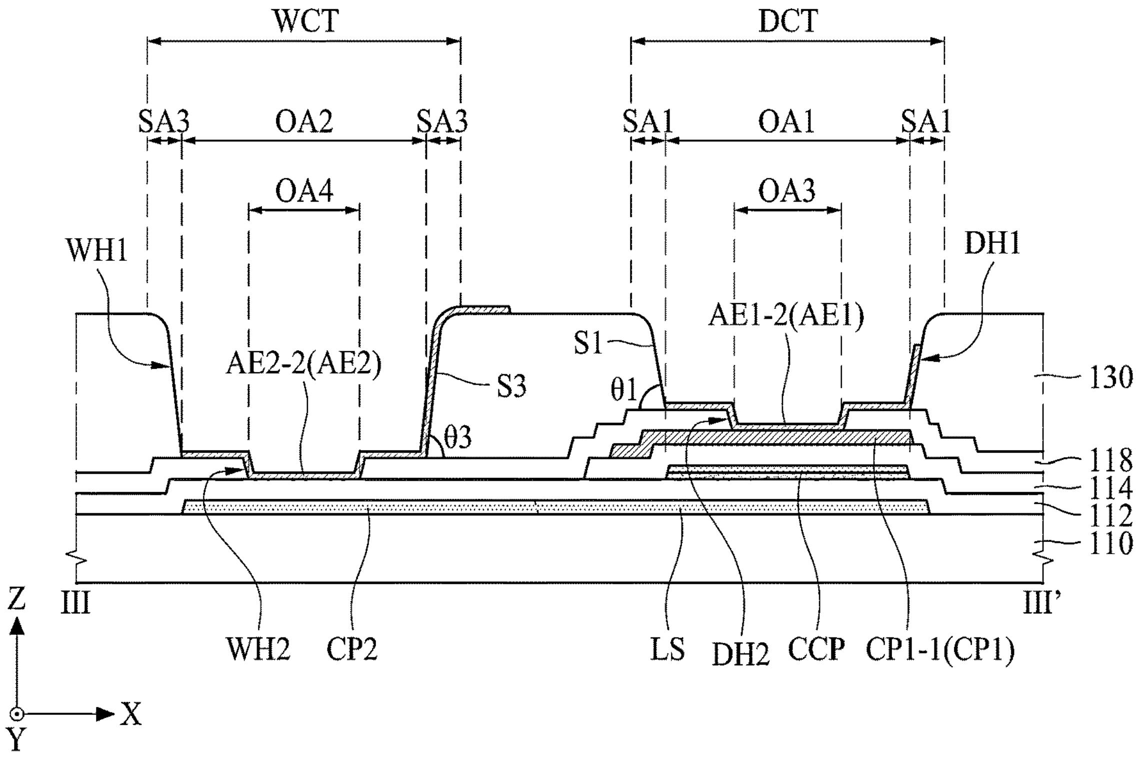
FIG. 8 is an example cross-sectional view along III-III' of the driving contact portion and welding contact portion of FIG. 5A.
Figure 9:
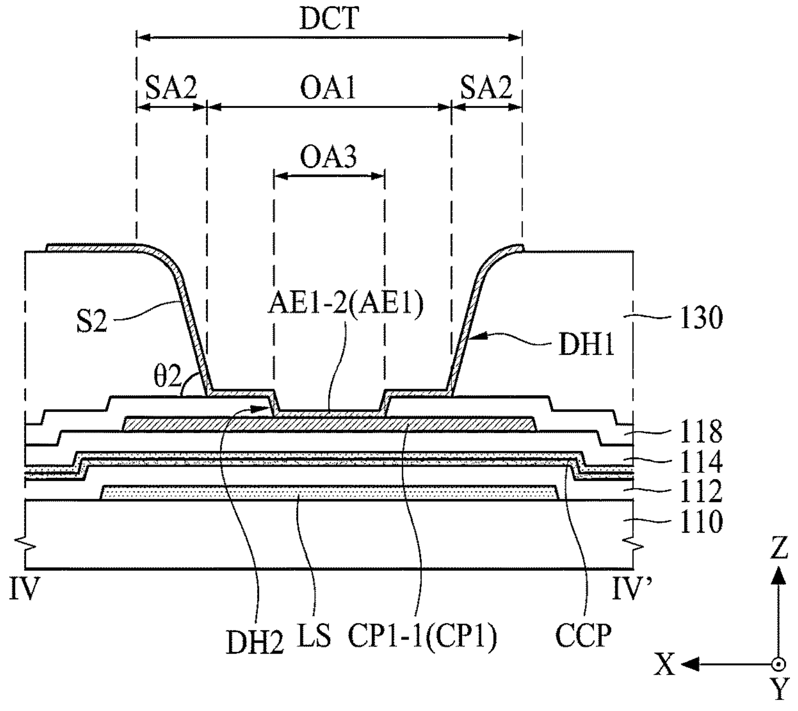
FIG. 9 is an example cross-sectional view along IV-IV' of the driving contact portion of FIG. 5A.
Figure 10:
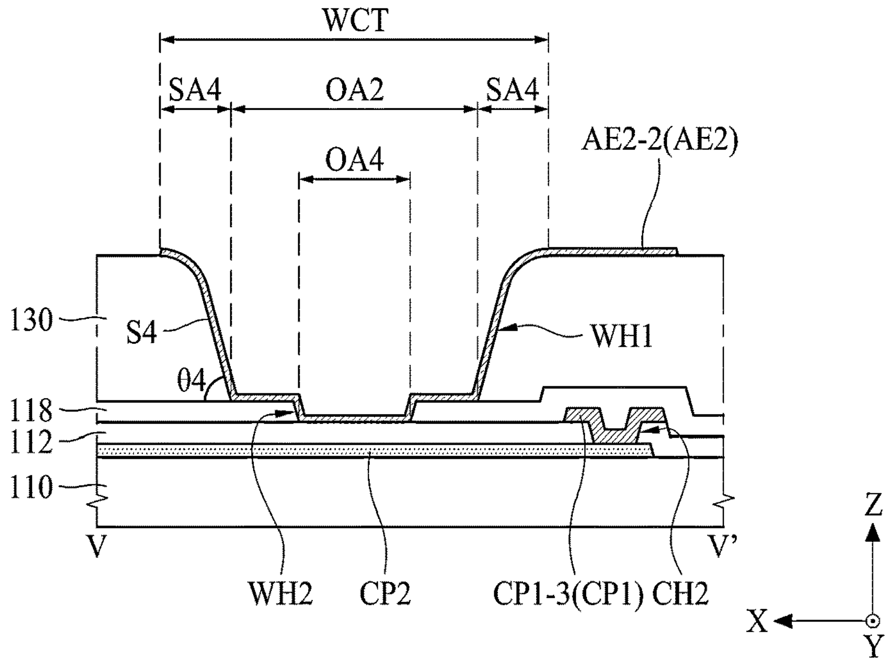
FIG. 10 is an example cross-sectional view along V-V' of the welding contact portion of FIG. 5A.
Figure 11:
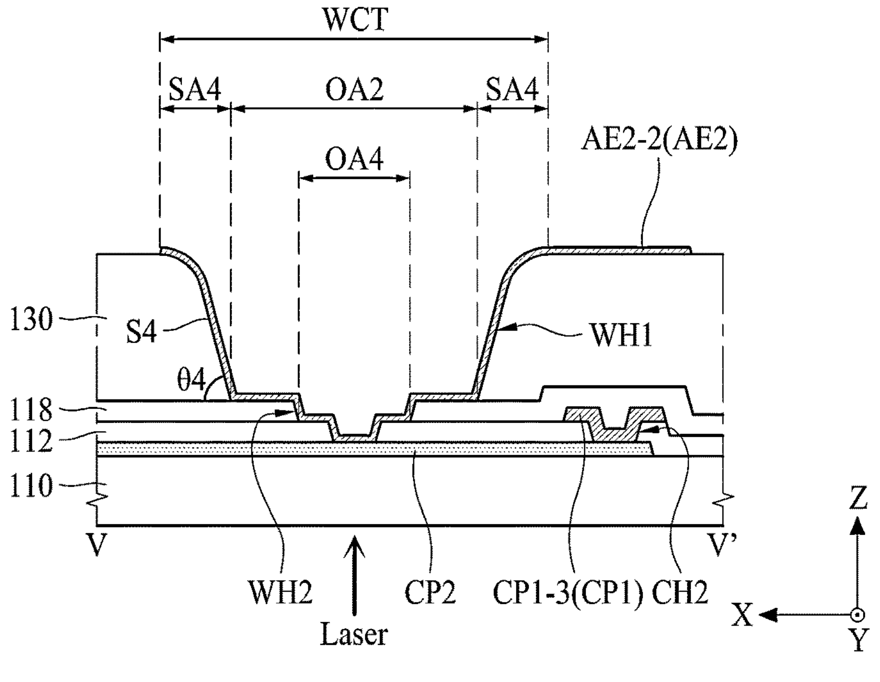
FIG. 11 is a cross-sectional view illustrating an example of irradiating a welding point with laser.

FIG. 5A is an example plan view illustrating a driving transistor and contact portions provided in a circuit area of FIG. 2. FIGS. 5B to 5D are example plan views illustrating some of the components shown in FIG. 5A. FIG. 6 is an example cross-sectional view along II-II' of a driving transistor of FIG. 5A. FIG. 7 is an example plan view illustrating an opening area of holes provided in a driving contact portion and a welding contact portion shown in FIG. 5A. FIG. 8 is an example cross-sectional view along III-III' of the driving contact portion and welding contact portion of FIG. 5A. FIG. 9 is an example cross-sectional view along IV-IV' of the driving contact portion FIG. 5A. FIG. 10 is an example cross-sectional view along V-V' of the welding contact portion of FIG. 5A. FIG. 11 is a cross-sectional view illustrating an example of irradiating a welding point with laser (e.g., a laser beam).

For convenience of description, the first substrate 100, the pixel circuit layer 110, the overcoat layer 130 and anode electrodes AE1 and AE2 are only shown in FIGS. 6 and 8 to 11, but the present disclosure is not limited thereto. It is not excluded that at least one of the light emitting layer EL, the cathode electrode CE, the encapsulation layer 200 or the second substrate 300 is stacked in the circuit area CA.

Referring to FIGS. 2, 5A to 5D, and 6, each of the first to fourth subpixels SP1 to SP4 may include a driving transistor DTR disposed in the circuit area CA. The driving transistor DTR is provided in the pixel circuit layer 110, and may include an active layer ACT and a gate electrode GE.

A light shielding layer LS may be provided over the first substrate 100. The light shielding layer LS may minimize or prevent a change in a threshold voltage of the driving transistor DTR due to external light. The light shielding layer LS may include a conductive material, for example, a single layer or multi-layer made of any one of molybdenum (Mo), aluminum (Al), chromium (Cr), gold (Au), titanium (Ti), nickel (Ni), neodymium (Nd) and copper (Cu) or their alloy. In this case, a buffer layer 112 may be provided between the light shielding layer LS and the active layer ACT. The buffer layer 112 may be an inorganic insulating layer, and may include a silicon oxide layer (SiOx), a silicon nitride layer (SiNx) or a multi-layer thereof.

The active layer ACT may be provided over the buffer layer 112. The active layer ACT may include a first active layer ACT1 and a second active layer ACT2. The first active layer ACT1 may be a semiconductor layer, and may include a semiconductor material based on any one of amorphous silicon, polycrystalline silicon, oxide and an organic material. For example, the first active layer ACT1 may include indium gallium zinc oxide (IGZO).

The second active layer ACT2 may be provided over the first active layer ACT1. The second active layer ACT2 may be a conductive layer, and may include any one of metals, such as aluminum (Al), gold (Au), silver (Ag), copper (Cu), tungsten (W), molybdenum (Mo), chromium (Cr), tantalum (Ta) and titanium (Ti), or their alloy. For example, the second active layer ACT2 may include molybdenum titanium (MoTi).

The second active layer ACT2 may be provided in an area other than a channel area CH of the driving transistor DTR on the first active layer ACT1. That is, only the first active layer ACT1 may be provided in the channel area CH of the driving transistor DTR. The active layer ACT may have a structure in which the first active layer ACT1 and the second active layer ACT2 are stacked in a source area S and a drain area D of the driving transistor DTR. The second active layer ACT2 provided in the source area S of the driving transistor DTR corresponds to the source electrode of the driving transistor DTR, and the second active layer ACT2 provided in the drain area D of the driving transistor DTR may correspond to the drain electrode of the driving transistor DTR.

A gate insulating layer 114 may be provided over the active layer ACT. The gate insulating layer 114 may be formed on only the active layer ACT (e.g., or only under the gate electrode GE), or may be formed on the entire surface of the first substrate 100 or the buffer layer 112, which includes the active layer ACT. The gate insulating layer 114 may include an inorganic insulating layer, for example, a silicon oxide layer (SiOx), a silicon nitride layer (SiNx) or a multi-layer thereof.

The gate electrode GE may be provided over the gate insulating layer 114 to at least partially overlap the channel area CH of the driving transistor DTR. The gate electrode GE may include a single layer or multi-layer made of any one of molybdenum (Mo), aluminum (Al), chromium (Cr), gold (Au), titanium (Ti), nickel (Ni), neodymium (Nd) and copper (Cu) or their alloy.

A passivation layer 118 may be provided to cover the pixel circuit that includes the driving transistor DTR. The passivation layer 118 may be an inorganic insulating layer, and may include, for example, a silicon oxide layer (SiOx), a silicon nitride layer (SiNx) or a multi-layer thereof.

An overcoat layer 130 may be provided over the pixel circuit layer 110, in which the driving transistor DTR is formed, to planarize a step difference caused by the driving transistor DTR.

In each of the first to fourth subpixels SP1 to SP4, two contact portions for electrically connecting the light emitting element 150 to the driving transistor DTR may be disposed in the circuit area CA. The contact portions may include a driving contact portion DCT and a welding contact portion WCT.

The driving contact portion DCT corresponds to a contact portion for electrically connecting the light emitting element 150 disposed in the light emission area EA of a specific subpixel with the driving transistor DTR disposed in the circuit area CA of a specific subpixel.

In detail, the plurality of pixels P may include a first pixel P1 and a second pixel P2, which are disposed to be adjacent to each other. The second pixel P2 may be disposed to be adjacent to the first pixel P1 in the second direction (e.g., Y-axis direction). Each of the first pixel P1 and the second pixel P2 may include a plurality of subpixels, for example, first to fourth subpixels SP1 to SP4 arranged in the first direction (e.g., X-axis direction). Each of the first to fourth subpixels SP1 to SP4 may include a light emission area EA and a circuit area CA.

The driving contact portion DCT may electrically connect the light emitting element 150 disposed in the light emission area EA of a subpixel SP1-1 provided in the first pixel P1 with the driving transistor DTR disposed in the circuit area CA of the subpixel SP1-1 provided in the first pixel P1. In this case, the subpixel SP1-1 provided in the first pixel P1 may be one of the first to fourth subpixels SP1 to SP4 provided in the first pixel P1.

The driving contact portion DCT may include at least one insulating layer that includes a first connection electrode CP1 (e.g., CP1-1, CP1-2, CP1-3) and a driving contact hole.

The first connection electrode CP1 may be electrically connected to the driving transistor DTR. The first connection electrode CP1 may include a first electrode pattern CP1-1 and a second electrode pattern CP1-2. For example, as shown in FIG. 5A, the second electrode pattern CP1-2 and the third electrode pattern CP1-3 can protrude or extend from the first electrode pattern CP1-1. Further, the second electrode pattern CP1-2 and the third electrode pattern CP1-3 can be disposed on opposite sides of the welding contact portion WCT.

In an example embodiment, the first electrode pattern CP1-1 and the second electrode pattern CP1-2 of the first connection electrode CP1 may be provided as one layer. The first electrode pattern CP1-1 and the second electrode pattern CP1-2 of the first connection electrode CP1 may be provided on the same layer as the gate electrode GE of the driving transistor DTR. The light shielding layer LS may be provided below the first connection electrode CP1 to shield external light incident on the first connection electrode CP1. In addition, a circuit pattern CCP (see, e.g., FIGS. 8 and 9) may be provided between the first connection electrode CP1 and the light shielding layer LS, and may be provided on the same layer as the active layer ACT of the driving transistor DTR, but the present disclosure is not limited thereto.

The first electrode pattern CP1-1 of the first connection electrode CP1 may be provided to overlap the driving contact hole. The first electrode pattern CP1-1 of the first connection electrode CP1 may be exposed in an area overlapped with the driving contact hole. The first electrode pattern CP1-1 of the first connection electrode CP1 may be electrically connected to the light emitting element 150 of the subpixel SP1-1 provided in the first pixel P1, especially the first anode electrode AE1 through the driving contact hole (see, e.g., FIGS. 3, 5A to 5D, 8 and 9).

Referring to FIGS. 7, 8 and 9, at least one insulating layer, which includes a driving contact hole, may be provided over the first electrode pattern CP1-1 of the first connection electrode CP1. The at least one insulating layer may include at least one of an organic insulating layer or an inorganic insulating layer. For example, the organic insulating layer may include the overcoat layer 130, and the inorganic insulating layer may include the passivation layer 118.

The overcoat layer 130 is provided over the first connection electrode CP1. The overcoat layer 130 may include a first driving contact hole DH1 (e.g., FIG. 8) that overlaps with at least a portion of the first connection electrode CP1, especially the first electrode pattern CP1-1. The first driving contact hole DH1 may include a first opening area OA1 passing through the overcoat layer 130, a first inclined area SA1 forming a first inclined surface S1 on the overcoat layer 130 and a second inclined area SA2 forming a second inclined surface S2 on the overcoat layer 130. The first opening area OA1 of the overcoat layer 130 is formed through a photo process that uses a full-tone photo mask. The first inclined area SA1 and the second inclined area SA2 of the overcoat layer 130 may be formed through a photo process that uses a half-tone photo mask.

The first driving contact hole DH1 of the overcoat layer 130 may include a first inclined surface S1 provided on a first side directed toward the welding contact portion WCT and a second side facing the first side, and a second inclined surface S2 provided on a third side directed toward the light emission area EA of the subpixel SP1-1 provided in the first pixel P1 and a fourth side facing the third side. The first inclined surface S1 and the second inclined surface S2, which are formed in the first driving contact hole DH1 of the overcoat layer 130 according to an example embodiment of the present disclosure, may have their respective inclinations different from each other.

In an example embodiment, a first inclination θ1 of the first inclined surface S1 may be greater than a second inclination θ2 of the second inclined surface S2. The inclination of each of the first inclined surface S1 and the second inclined surface S2 may be determined depending on a width of a half-tone photo mask. As shown in FIG. 7, the first inclined surface S1 may be formed using a half-tone photo mask having a third width W3, and the second inclined surface S2 may be formed using a half-tone photo mask having a fourth width W4 greater than the third width W3. The first inclined surface S1 may be formed to have a steep inclination by using a half-tone photo mask having a small width. On the other hand, the second inclined surface S2 may be formed to have a gentle inclination by using a half-tone photo mask having a large width.

The passivation layer 118 may be provided between the overcoat layer 130 and the first connection electrode CP1. The passivation layer 118 may include a second driving contact hole DH2 that at least partially overlaps with the first driving contact hole DH1 of the overcoat layer 130. For example, the first driving contact hole DH1 can be larger than the second driving contact hole DH2, and the first and second driving contact holes DH1, DH2 can overlap with each other. The second driving contact hole DH2 of the passivation layer 118 may include a third opening area OA3 that exposes the first electrode pattern CP1-1 of the first connection electrode CP1 by passing through the passivation layer 118. The third opening area OA3 of the passivation layer 118 may be formed through a wet etching process.

The third opening area OA3 of the passivation layer 118 may be disposed in the first opening area OA1 of the overcoat layer 130, and may have a size smaller than that of the first opening area OA1. For example, the first opening area OA1 of the overcoat layer 130 may have a rectangular shape having a first width W1 as shown in FIG. 7, and the third opening area OA3 of the passivation layer 118 may have a rectangular shape having a second width W2 smaller than the first width W1 (e.g., W1>W2), but the present disclosure is not limited thereto. The first opening area OA1 of the overcoat layer 130 and the third opening area OA3 of the passivation layer 118 may be formed in one of various shapes such as a circular shape, an oval shape and a polygonal shape. The first driving contact hole DH1 of the overcoat layer 130 may expose the second driving contact hole DH2 of the passivation layer 118 and a portion of an upper surface of the passivation layer 118.

The first electrode pattern CP1-1 of the first connection electrode CP1 may be electrically connected to the first anode electrode AE1 of the subpixel SP1-1 provided in the first pixel P1 through the driving contact hole DCT that includes the first driving contact hole DH1 of the overcoat layer 130 and the second driving contact hole DH2 of the passivation layer 118.

The subpixel SP1-1 provided in the first pixel P1 may include the light emitting element 150 that includes the first anode electrode AE1. The first anode electrode AE1 may include a first light emitting portion AE1-1 disposed in the light emission area EA of the subpixel SP1-1 provided in the first pixel P1 and a first connection portion AE1-2 disposed in the circuit area CA of the subpixel SP1-1 provided in the first pixel P1 (see, e.g., FIG. 5A).

The first connection portion AE1-2 may be protruded from the first light emitting portion AE1-1 and extended in a direction of the circuit area CA. The first connection portion AE1-2 may have one end provided to overlap with the driving contact hole. In detail, the first connection portion AE1-2 may be provided in the driving contact hole that includes the first driving contact hole DH1 of the overcoat layer 130 and the second driving contact hole DH2 of the passivation layer 118. The first connection portion AE1-2 may be in contact with the first electrode pattern CP1-1 of the first connection electrode CP1 in the driving contact hole (see, e.g., DH1 or DH2). Therefore, the first anode electrode AE1 may be electrically connected to the first connection electrode CP1.

Meanwhile, as shown in FIG. 5A, the second electrode pattern CP1-2 of the first connection electrode CP1 may be protruded from the first electrode pattern CP1-1 and extended to an area overlapped with the driving transistor DTR. The second electrode pattern CP1-2 of the first connection electrode CP1 may be provided between the welding contact portion WCT and the light emission area EA provided in the subpixel SP1-1 of the first pixel P1. That is, the second electrode pattern CP1-2 of the first connection electrode CP1 may be provided between the welding contact portion WCT and the first light emitting portion AE1-1 of the first anode electrode AE1 provided in the subpixel SP1-1 of the first pixel P1.

The second electrode pattern CP1-2 of the first connection electrode CP1 may be electrically connected to the second active layer ACT2 disposed in the source area S or the drain area D through a first contact hole CH1 passing through the gate insulating layer 114 as shown in FIG. 6. As a result, the first anode electrode AE1 may be electrically connected to the driving transistor DTR through the first connection electrode CP1. Therefore, the first anode electrode AE1 may be supplied with a pixel power source from the driving transistor DTR.

Referring back to FIG. 5A, the welding contact portion WCT corresponds to a contact portion for electrically connecting the light emitting element 150 disposed in the light emission area EA of an adjacent subpixel disposed to be adjacent to a specific subpixel with the driving transistor DTR disposed in the circuit area CA of a specific subpixel.

In detail, the welding contact portion WCT may electrically connect the light emitting element 150 disposed in the light emission area EA of the adjacent subpixel SP1-2 provided in the second pixel P2 with the driving transistor DTR disposed in the circuit area CA of the subpixel SP1-1 provided in the first pixel P1. In this case, the adjacent subpixel SP1-2 provided in the second pixel P2 may be one of the first to fourth subpixels SP1 to SP4 provided in the second pixel P2, and may emit light of the same color as that of the subpixel SP1-1 provided in the first pixel P1.

In the light emitting display apparatus according to an example embodiment of the present disclosure, when a defect occurs in the driving transistor of the adjacent subpixel SP1-2 provided in the second pixel P2, the driving transistor DTR of the subpixel SP1-1 provided in the first pixel P1 may be electrically connected with the light emitting element 150 of the adjacent subpixel SP1-2 through the welding contact portion WCT. Therefore, in the light emitting display apparatus according to an example embodiment of the present disclosure, in spite of the defect of the driving transistor, the light emitting element 150 of the adjacent subpixel SP1-2 may operate normally. For example, the welding contact portion WCT can provide a type of fail-over option for allowing the subpixel to be driven by the driving transistor of an adjacent subpixel if its own driving transistor turns out to be defective (e.g., two subpixels of the same color in adjacent rows can be tied together, see FIGS. 1 and 2).

The welding contact portion WCT may electrically separate the driving transistor DTR of the subpixel SP1-1 provided in the first pixel P1 from the light emitting element 150 of the adjacent subpixel SP1-2 when the driving transistor of the adjacent subpixel SP1-2 provided in the second pixel P2 is normal. On the other hand, when a defect does occurs in the driving transistor of the adjacent subpixel SP1-2 provided in the second pixel P2, the welding contact portion WCT may electrically connect the light emitting element 150 of the adjacent subpixel SP1-2 with the driving transistor DTR of the subpixel SP1-1 provided in the first pixel P1 through laser irradiation.

The welding contact portion WCT may include at least one insulating layer that includes a second connection electrode CP2 and a welding contact hole.

Referring to FIGS. 7, 8 and 10, the second connection electrode CP2 may be electrically connected to the driving transistor DTR of the subpixel SP1-1 provided in the first pixel P1. The second connection electrode CP2 may be provided on a different layer from the first connection electrode CP1. In an example embodiment, the second connection electrode CP2 may be provided on the same layer as the light shielding layer LS. The second connection electrode CP2 may be extended from the light shielding layer LS and formed as one layer, but is not limited thereto. The second connection electrode CP2 may be formed as one pattern spaced apart from the light shielding layer LS.

The second connection electrode CP2 may be provided to overlap the welding contact hole. The second connection electrode CP2 may be spaced apart from the light emitting element 150 of the adjacent subpixel SP1-2 provided in the second pixel P2, especially the second anode electrode AE2 with an insulating layer, for example, the buffer layer 112 interposed therebetween in an area overlapped with the welding contact hole. The second connection electrode CP2 may be electrically separated from the second anode electrode AE2 of the adjacent subpixel SP1-2.

At least one insulating layer that includes the welding contact hole may be provided over the second connection electrode CP2. The at least one insulating layer may include at least one of an organic insulating layer or an inorganic insulating layer. For example, the organic insulating layer may include the overcoat layer 130, and the inorganic insulating layer may include the passivation layer 118.

The overcoat layer 130 may include a first welding contact hole WH1 provided on the second connection electrode CP2 and overlapped with at least a portion of the second connection electrode CP2. The first welding contact hole WH1 of the overcoat layer 130 may include a second opening area OA2 passing through the overcoat layer 130, a third inclined area SA3 forming a third inclined surface S3 on the overcoat layer 130 and a fourth inclined area SA4 forming a fourth inclined surface S4 on the overcoat layer 130. The second opening area OA2 of the overcoat layer 130 may be formed through a photo process that uses a full-tone photo mask, and the third inclined area SA3 and the fourth inclined area SA4 of the overcoat layer 130 may be formed through a photo process that uses a half-tone photo mask.

The first welding contact hole WH1 of the overcoat layer 130 may include a third inclined surface S3 provided on a first side directed toward the driving contact portion DCT and a second side facing the first side, and a fourth inclined surface S4 provided on a third side directed toward the light emission area EA of the subpixel SP1-1 provided in the first pixel P1 and a fourth side facing the third side. The third inclined surface S3 and the fourth inclined surface S4, which are formed in the first welding contact hole WH1 of the overcoat layer 130 according to an example embodiment of the present disclosure, may have their respective inclinations different from each other.

In an example embodiment, a third inclination θ3 of the third inclined surface S3 may be greater than a fourth inclination θ4 of the fourth inclined surface S4. The inclination of each of the third inclined surface S3 and the fourth inclined surface S4 may be determined depending on a width of a half-tone photo mask. As shown in FIG. 7, the third inclined surface S3 may be formed using a half-tone photo mask having a third width W3, and the fourth inclined surface S4 may be formed using a half-tone photo mask having a fourth width W4 greater than the third width W3 (e.g., W4>W3). The third inclined surface S3 may be formed to have a steep inclination by using a half-tone photo mask having a small width. On the other hand, the fourth inclined surface S4 may be formed to have a gentle inclination by using a half-tone photo mask having a large width.

The passivation layer 118 may be provided between the overcoat layer 130 and the second connection electrode CP2. The passivation layer 118 may include a second welding contact hole WH2 that at least partially overlaps the first welding contact hole WH1 of the overcoat layer 130. The second welding contact hole WH2 of the passivation layer 118 may include a fourth opening area OA4 that passes through the passivation layer 118. The fourth opening area OA4 of the passivation layer 118 may be formed through a wet etching process. Further, the first welding contact hole WH1 can be larger than the second welding contact hole WH2, and the first welding contact hole WH1 can be located over the second welding contact hole WH2.

The fourth opening area OA4 of the passivation layer 118 may be disposed in the second opening area OA2 of the overcoat layer 130, and may have a size smaller than that of the second opening area OA2 (e.g., OA4<OA2). For example, the second opening area OA2 of the overcoat layer 130 may have a rectangular shape having a first width W1 as shown in FIG. 7, and the fourth opening area OA4 of the passivation layer 118 may have a rectangular shape having a second width W2 smaller than the first width W1 (e.g., W2<W1), but the present disclosure is not limited thereto. The second opening area OA2 of the overcoat layer 130 and the fourth opening area OA4 of the passivation layer 118 may be formed in one of various shapes such as a circular shape, an oval shape and a polygonal shape. The first welding contact hole WH1 of the overcoat layer 130 may expose the second welding contact hole WH2 of the passivation layer 118 and a portion of the upper surface of the passivation layer 118.

When a defect occurs in a driving transistor of an adjacent subpixel SP1-2 provided in a second pixel P2, a welding contact hole including a second welding contact hole WH2 of the passivation layer 118 may correspond to a welding point WP for laser irradiation to electrically connect a second connection electrode CP2 and a second anode electrode AE2 of the adjacent subpixel SP1-2.

When the driving transistor of the adjacent subpixel SP1-2 provided in the second pixel P2 is operating as normal (e.g., non-defective), then the second connection electrode CP2 may be electrically separated from the second anode electrode AE2 of the adjacent subpixel SP1-2 with the buffer layer 112 interposed therebetween in the welding contact hole that includes the first welding contact hole WH1 of the overcoat layer 130 and the second welding contact hole WH2 of the passivation layer 118, as shown in FIGS. 8 and 10.

On the other hand, when a defect occurs in the driving transistor of the adjacent subpixel SP1-2 provided in the second pixel P2, the second connection electrode CP2 may be electrically connected to the second anode electrode AE2 of the adjacent subpixel SP1-2, which has been electrically separated therefrom, by irradiating laser to the welding contact hole as shown in FIG. 11. For example, in this way, the two adjacent subpixels can be tied together and driven by the same driving transistor, and the presence of a dead subpixel can be avoided.

In detail, the adjacent subpixel SP1-2 provided in the second pixel P2 may include the light emitting element 150 that includes the second anode electrode AE2. The second anode electrode AE2 may include a second light emitting portion AE2-1 disposed in the light emission area EA of the adjacent subpixel SP1-2 provided in the second pixel P2 and a second connection portion AE2-2 disposed in the circuit area CA of the subpixel SP1-1 provided in the first pixel P1.

The second connection portion AE2-2 may be protruded from the second light emitting portion AE2-1 and extended in the direction of the circuit area CA of the subpixel SP1-1 provided in the first pixel P1. The second connection portion AE2-2 may be provided to have one end overlapped with the welding contact hole. The second connection portion AE2-2 of the second anode electrode AE2 may be provided in the welding contact hole that includes the first welding contact hole WH1 of the overcoat layer 130 and the second welding contact hole WH2 of the passivation layer 118, and may be electrically separated from the second connection electrode CP2 with the buffer layer 112 interposed therebetween in the welding contact hole.

When a defect is observed in the driving transistor of the adjacent subpixel SP1-2 provided in the second pixel P2 during a defect inspection, laser may be irradiated to the welding contact hole, particularly, the welding point WP corresponding to the second welding contact hole WH2 of the passivation layer 118. Herein, the welding point WP may be specified by using the shape of the second connection electrode CP2.

Figure 12:
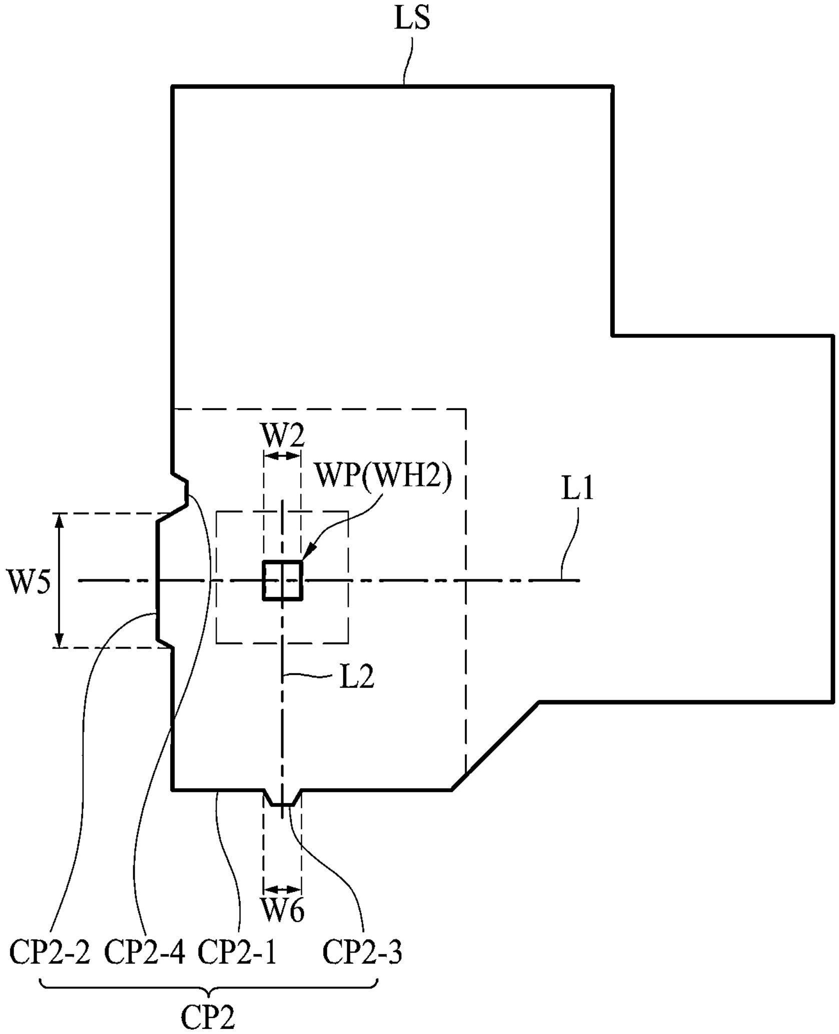
FIG. 12 is a plan view illustrating an example of a shape of a second connection electrode.

As shown in FIG. 12, the second connection electrode CP2 may include a connection electrode portion CP2-1, a first protruding portion CP2-2, and a second protruding portion CP2-3. In FIG. 12, the second connection electrode CP2 is integrally formed with a light shielding layer LS, but the present disclosure is not limited thereto. The second connection electrode CP2 may be a metal pattern overlapped with a welding contact portion WCT, and the position or location of the second connection electrode CP2 may be changed. In an example, the second connection electrode CP2 may be a metal pattern provided on a layer different from that of the light shielding layer LS, and the second connection electrode CP2 may be a metal pattern spaced apart from the light shielding layer LS even though in FIG. 12, the second connection electrode CP2 is provided on the same layer as the light shielding layer LS.

The connection electrode portion CP2-1 of the second connection electrode CP2 may be overlapped with the welding contact portion WCT. Particularly, when laser is irradiated by a welding process, and the connection electrode portion CP2-1 is overlapped with the welding point WP corresponding to the second welding contact hole WH2 of the passivation layer 118, the connection electrode portion CP2-1 may be electrically connected to a second connection portion AE2-2 of the second anode electrode AE2 (see, e.g., FIG. 11).

The first protruding portion CP2-2 of the second connection electrode CP2 may protrude in a first direction (for example, X-axis direction) from the connection electrode portion CP2-1. The first protruding portion CP2-2 may be overlapped with the welding contact portion WCT in the first direction (for example, X-axis direction) on a plane. The welding contact portion WCT may be disposed on a first line L1 provided to pass through the center of the first protruding portion CP2-2 and to be parallel to the first direction (for example, X-axis direction). Furthermore, the welding point WP corresponding to the second welding contact hole WH2 of the passivation layer 118 may be disposed on the first line L1 provided to pass through the center of the first protruding portion CP2-2 and to be parallel to the first direction (for example, X-axis direction).

The second protruding portion CP2-3 of the second connection electrode CP2 may protrude in a second direction (for example, Y-axis direction) from the connection electrode portion CP2-1. The second protruding portion CP2-3 may be overlapped with the welding contact portion WCT in the second direction (for example, Y-axis direction) on a plane. The welding contact portion WCT may be disposed on a second line L2 provided to pass through the center of the second protruding portion CP2-3 and to be parallel to the second direction (for example, Y-axis direction). Furthermore, the welding point WP corresponding to the second welding contact hole WH2 of the passivation layer 118 may be disposed on the second line L2 provided to pass through the center of the second protruding portion CP2-3 and to be parallel to the second direction (for example, Y-axis direction).

As a result, the welding point WP may be disposed in the region in which the first line L1 passing through the center of the first protruding portion CP2-2 and parallel to the first direction (for example, X-axis direction) and the second line L2 passing through the center of the second protruding portion CP2-3 and parallel to the second direction (for example, Y-axis direction) are perpendicular to each other.

The pattern shape of the second connection electrode CP2 may be recognized on a rear surface of a first substrate 100. Accordingly, the welding point WP may be specified as the region in which the first protruding portion CP2-2 and the second protruding portion CP2-3 of the second connection electrode CP2 are identified through the rear surface of the first substrate 100, and the first line L1 passing through the center of the first protruding portion CP2-2 and parallel to the first direction (for example, X-axis direction) and the second line L2 passing through the center of the second protruding portion CP2-3 and parallel to the second direction (for example, Y-axis direction) are perpendicular to each other.

When laser is irradiated to the specified welding point WP, the second connection portion AE2-2 of the second anode electrode AE2 may be in contact with the second connection electrode CP2 in the welding contact hole as shown in FIG. 11. Accordingly, the second anode electrode AE2 may be electrically connected to the second connection electrode CP2.

The light emitting display apparatus according to an example embodiment of the present disclosure may increase a repair success rate by specifying the welding point WP through the use of first protruding portion CP2-2 and second protruding portion CP2-3 of the second connection electrode CP2. Accordingly, the light emitting display apparatus according to an example embodiment of the present disclosure may improve product yield.

On the other hand, at least one of the first protruding portion CP2-2 and the second protruding portion CP2-3 of the second connection electrode CP2 may be equal to or smaller in width than the second welding contact hole WH2 of the passivation layer 118. Specifically, a width W5 in a direction perpendicular to a protrusion direction of the first protruding portion CP2-2 of the second connection electrode CP2 may be equal to or less than a width of the second welding contact hole WH2 of the passivation layer 118. Alternatively, as shown in FIG. 12, a width W6 in a direction perpendicular to a protrusion direction of the second protruding portion CP2-3 may be equal to or less than the width of the second welding contact hole WH2 of the passivation layer 118.

In the light emitting display apparatus according to an example embodiment of the present disclosure, the width of at least one of the first protruding portion CP2-2 and the second protruding portion CP2-3 of the second connection electrode CP2 is equal to or smaller than the width of the second welding contact hole WH2 of the passivation layer 118 so that it is possible to accurately specify the welding point WP.

According to an example embodiment of the present disclosure, the second connection electrode CP2 may further include a concave portion CP2-4. The concave portion CP2-4 may be disposed adjacent to at least one of the first protruding portion CP2-2 and the second protruding portion CP2-3. Specifically, as shown in FIG. 12, the second connection electrode CP2 may include the concave portion CP2-4 which is disposed adjacent to one side of the first protruding portion CP2-2 and is concavely provided in a direction opposite to the protrusion direction of the first protruding portion CP2-2. Alternatively, the second connection electrode CP2 may include the concave portion CP2-4 which is disposed adjacent to one side of the second protruding portion CP2-3 and is concavely provided in a direction opposite to the protrusion direction of the second protruding portion CP2-3.

In the light emitting display apparatus according to an example embodiment of the present disclosure, the concave portion CP2-4 is disposed adjacent to at least one of the first protruding portion CP2-2 and the second protruding portion CP2-3 on the second connection electrode CP2 so that the first protruding portion CP2-2 or the second protruding portion CP2-3 may be more easily recognized on the rear surface of the first substrate 100.

The second connection electrode CP2 may be electrically connected to the driving transistor DTR through the first connection electrode CP1. In an example embodiment of the present disclosure, the first connection electrode CP1 may further include a third electrode pattern CP1-3. A first electrode pattern CP1-1, a second electrode pattern CP1-2, and the third electrode pattern CP1-3 of the first connection electrode CP1 may be provided as one layer.

As shown in FIG. 5A, the third electrode pattern CP1-3 of the first connection electrode CP1 protrudes from the first electrode pattern CP1-1 and extends to a region below the welding contact portion WCT. The third electrode pattern CP1-3 of the first connection electrode CP1 may be provided between the welding contact portion WCT and the light emission area EA provided in the adjacent subpixel SP1-2 of the second pixel P2. That is, the third electrode pattern CP1-3 of the first connection electrode CP1 may be provided between the welding contact portion WCT and the second light emission portion AE2-1 of the second anode electrode AE2 provided in the adjacent subpixel SP1-2 of the second pixel P2.

The third electrode pattern CP1-3 of the first connection electrode CP1 may be electrically connected to the second connection electrode CP2 through a second contact hole CH2 passing through a buffer layer 112 as shown in FIG. 10. Meanwhile, as shown in FIG. 6, the second electrode pattern CP1-2 of the first connection electrode CP1 may be electrically connected to a second active layer ACT2 disposed in a source region S or a drain region D through a first contact hole CH1 passing through a gate insulating layer 114. As a result, the second anode electrode AE2 may be electrically connected to the driving transistor DTR through the first connection electrode CP1 and the second connection electrode CP2. Accordingly, the second anode electrode AE2 may be supplied with pixel power from the driving transistor DTR provided in the subpixel SP1-1 of the first pixel P1.

In one or more example embodiments such as those illustrated in FIGS. 5A to 5D, 6, and 8, The first welding contact hole WH1 may be overlapped with at least a portion of the second connection electrode CP2. The second welding contact hole WH2 may be overlapped with the first welding contact hole WH1. The first welding contact hole WH1 may be in the overcoat layer 130. The second welding contact hole WH2 may be in the passivation layer 118. The first electrode pattern CP1-1 may be overlapped with the first driving contact hole DH1. The second electrode pattern CP1-2 may protrude from the first electrode pattern CP1-1 and may be provided above the first welding contact hole WH1. For example, the second electrode pattern CP1-2 may be disposed on the same layer as the first electrode pattern CP1-1 (e.g., on the same layer as the gate electrode GE of the driving transistor DTR), and thus the second electrode pattern CP1-2 may be provided above a bottom portion of the first welding contact hole WH1 (see, e.g., FIGS. 6 and 8). The third electrode pattern CP1-3 may protrude from the first electrode pattern CP1-1 and may be provided under the first welding contact hole WH1.

The light emitting display apparatus according to an example embodiment of the present disclosure may include multiple pixels (see, e.g., P of FIG. 1; P1 and P2 of FIG. 5A), and each pixel may include multiple subpixels (see, e.g., SP of FIG. 1; SP1 to SP4 in FIG. 2; SP1-1 and SP1-2 of FIG. 5A). In an example embodiment, a driving transistor (see, e.g., DTR of FIGS. 5 and 6) may be provided in each subpixel of the multiple pixels. In an example embodiment, a light emitting element (see, e.g., 150 of FIG. 3) may be provided in each subpixel of the multiple pixels. In an example embodiment, a light emitting element (see, e.g., 150 of FIG. 3) of each subpixel of the multiple pixels may include an anode electrode (see, e.g., AE of FIGS. 2 and 3; AE1 or AE2 of FIG. 5A, a light emitting layer (see, e.g., EL of FIG. 3), and a cathode electrode (see, e.g., CE of FIG. 3).

The light emitting display apparatus according to an example embodiment of the present disclosure includes a light extraction unit 140 (e.g., light extraction part), thereby improving light extraction efficiency of light emitted from a light emitting element layer. Accordingly, the light emitting display apparatus according to an example embodiment of the present disclosure may have high luminous efficiency even with low power, thereby reducing power consumption.

In the light emitting display apparatus according to an example embodiment of the present disclosure, the driving contact portion DCT and the welding contact portion WCT may be arranged to be adjacent in the first direction (for example, X-axis direction). Specifically, in the light emitting display apparatus according to an example embodiment of the present disclosure, the driving contact portion DCT and the welding contact portion WCT may be adjacently arranged on the first line parallel to the first direction (for example, X-axis direction) in a circuit area CA provided in one subpixel area. At least a portion of each of the driving contact portion DCT and the welding contact portion WCT may be overlapped with the first line. Herein, the first line may be a line parallel to the second line in which first to fourth subpixels SP1 to SP4 provided in one pixel P are arranged. That is, the driving contact portion DCT and the welding contact portion WCT may be disposed in the same direction as the direction in which the first to fourth subpixels SP1 to SP4 provided in one pixel P are arranged.

In the light emitting display apparatus according to an example embodiment of the present disclosure, the driving contact portion DCT and the welding contact portion WCT are disposed adjacent to each other in the first direction (for example, X-axis direction) so that it is possible to reduce the size of the circuit area CA. The length of the first direction (for example, X-axis direction) of the circuit area CA is determined by the length of the first direction (for example, X-axis direction) of the light emission area EA, whereby it is impossible to arbitrarily reduce the length of the first direction of the circuit area CA. In addition, when the length of the first direction (for example, X-axis direction) of the circuit area CA is reduced, the length of the first direction (for example, X-axis direction) of the light emission area EA is also reduced, thereby reducing the area of the light emission area EA. Accordingly, it is not preferable to reduce the area of the circuit area CA by reducing the length of the first direction (for example, X-axis direction) of the circuit area CA.

Meanwhile, the length of the second direction (for example, Y-axis direction) of the circuit area CA may have a reverse relationship with the length of the second direction (for example, Y-axis direction) of the light emission area EA. When the length of the second direction (for example, Y-axis direction) of the circuit area CA is reduced, the length of the second direction (for example, Y-axis direction) of the light emission area EA may be increased. In the light emitting display apparatus according to an example embodiment of the present disclosure, the driving contact portion DCT and the welding contact portion WCT are disposed adjacent to each other in the first direction (for example, X-axis direction) so that it is possible to reduce the length of the second direction (for example, Y-axis direction) of the circuit area CA. Accordingly, the light emitting display apparatus according to an example embodiment of the present disclosure may increase the length of the second direction (for example, Y-axis direction) of the light emission area EA, and thus may increase the area of the light emission area EA.

In the light emitting display apparatus according to an example embodiment of the present disclosure, inclined surfaces formed in a first driving contact hole DH1 of the driving contact portion DCT and a first welding contact hole WH1 of the welding contact portion WCT may have different slopes.

In detail, the first driving contact hole DH1 of the driving contact portion DCT passing through an overcoat layer 130 may be provided with a first inclined surface S1 provided on a first side facing the welding contact portion WCT and a second side facing the first side, and may be provided with a second inclined surface S2 provided on a third side facing the light emission area EA of the subpixel SP1-1 provided in the first pixel P1 and a fourth side facing the third side. In the light emitting display apparatus according to an example embodiment of the present disclosure, a first inclination θ1 of the first inclined surface S1 formed in the first driving contact hole DH1 may be formed to be larger than a second inclination θ2 of the second inclined surface S2.

The first welding contact hole WH1 of the welding contact portion WCT passing through the overcoat layer 130 may be provided with a third inclined surface S3 provided on a first side facing the driving contact portion DCT and a second side facing the first side, and may be provided with a fourth inclined surface S4 provided on a third side facing the light emission area EA of the subpixel SP1-1 of the first pixel P1 and a fourth side facing the third side. In the light emitting display apparatus according to an example embodiment of the present disclosure, a third inclination θ3 of the third inclined surface S3 formed in the first welding contact hole WH1 may be formed to be larger than a fourth inclination θ4 of the fourth inclined surface S4.

That is, the first driving contact hole DH1 of the driving contact portion DCT and the first welding contact hole WH1 of the welding contact portion WCT may be formed such that an inclined surface formed between the driving contact portion DCT and the welding contact portion WCT has a high degree of inclination. Accordingly, in the light emitting display apparatus according to an example embodiment of the present disclosure, the driving contact portion DCT and the welding contact portion WCT are arranged in the first direction (for example, X-axis direction), whereby it is possible to increase the size of the first driving contact hole DH1 of the driving contact portion DCT and the first welding contact hole WH1 of the welding contact portion WCT.

The first driving contact hole DH1 of the driving contact portion DCT formed on the overcoat layer 130 and the first welding contact hole WH1 of the welding contact portion WCT formed on the overcoat layer 130 may increase in size as necessary during a manufacturing process. Particularly, it is possible to increase the size in each of a first opening area OA1 of the first driving contact hole DH1 of the driving contact portion DCT and a second opening area OA2 of the first welding contact hole WH1 of the welding contact portion WCT. When the size of each of the first opening area OA1 of the first driving contact hole DH1 of the driving contact portion DCT and the second opening area OA2 of the first welding contact hole WH1 of the welding contact portion WCT increases, a distance between the first driving contact hole DH1 of the driving contact portion DCT and the first welding contact hole WH1 of the welding contact portion WCT may be reduced. When a minimum interval is not secured between a half tone mask for forming the inclined surface of the first driving contact hole DH1 of the driving contact portion DCT and a half tone mask for forming the inclined surface of the first welding contact hole WH1 of the welding contact portion WCT, the inclined surface may not be formed in a desired shape between the first driving contact hole DH1 and the first welding contact hole WH1. Thus, it is difficult to stably form the anode electrode in each of the first driving contact hole DH1 and the first welding contact hole WH1.

In order to stably form the anode electrode, when the minimum interval is secured between the half tone mask for forming the inclined surface of the first driving contact hole DH1 of the driving contact portion DCT and the half tone mask for forming the inclined surface of the first welding contact hole WH1 of the welding contact portion WCT, the length of the first direction (for example, X-axis direction) of the region in which the driving contact portion DCT and the welding contact portion WCT are formed may be increased. When the light emitting display apparatus has a high resolution, the length of the first direction (for example, X-axis direction) of the light emission area EA and the circuit area CA decreases, whereby the first driving contact hole DH1 of the driving contact portion DCT and the first welding contact hole WH1 of the welding contact portion WCT are not disposed in a line in the first direction (for example, X-axis direction), but disposed in a line in the second direction (for example, Y-axis direction). In this case, the area of the light emission area EA may be reduced by the increase in area of the circuit area CA.

In the light emitting display apparatus according to an example embodiment of the present disclosure, when the first driving contact hole DH1 of the driving contact portion DCT and the first welding contact hole WH1 of the welding contact portion WCT are formed, the inclined surface between the driving contact portion DCT and the welding contact portion WCT has a high degree of inclination so that it is possible to secure the minimum distance between the half tone mask for forming the first inclined surface S1 of the first driving contact hole DH1 of the driving contact portion DCT and the half tone mask for forming the third inclined surface S3 of the first welding contact hole WH1 of the welding contact portion WCT. Accordingly, the inclined surface may be formed in a desired shape between the first driving contact hole DH1 and the first welding contact hole WH1. Accordingly, the anode electrode formed in each of the first driving contact hole DH1 and the first welding contact hole WH1 may be stably formed. Furthermore, since there is no need to increase the length of the first direction (for example, X-axis direction) of the area in which the driving contact portion DCT and the welding contact portion WCT are formed, the driving contact portion DCT and the welding contact portion WCT may be arranged adjacent to each other in the first direction (for example, X-axis direction) even in a high-resolution light emitting display apparatus.

Meanwhile, the first driving contact hole DH1 of the driving contact portion DCT and the first welding contact hole WH1 of the welding contact portion WCT may be formed such that its inclined surface with the light emission area EA having the light extraction unit 140 has a low degree of inclination. Accordingly, in the light emitting display apparatus according to an example embodiment of the present disclosure, it is possible to stably form the light extraction unit 140 disposed adjacent to the circuit area CA. That is, in the light emitting display apparatus according to an example embodiment of the present disclosure, it is possible to prevent the light extraction efficiency from being reduced by the deformation in shape of the light extraction unit 140 disposed adjacent to the circuit area CA.

In the light emitting display apparatus according to an example embodiment of the present disclosure, the second anode electrode AE2 may be formed to cover the third inclined surface S3 in the first welding contact hole WH1 of the welding contact portion WCT. Accordingly, the light emitting display apparatus according to an example embodiment of the present disclosure may prevent an etchant from penetrating into the area between the third inclined surface S3 of the overcoat layer 130 and the passivation layer 118 when the second anode electrode AE2 is formed.

The overcoat layer 130 formed between the first driving contact hole DH1 of the driving contact portion DCT and the first welding contact hole WH1 of the welding contact portion WCT may be provided with an edge region of the first connection electrode CP1 as shown in FIG. 8. When the second anode electrode AE2 does not cover the third inclined surface S3 in the first welding contact hole WH1 of the welding contact portion WCT, the etchant may be easily permeated into the passivation layer 118 when the second anode electrode AE2 is formed. In this case, if a seam exists in the passivation layer 118, the etchant may be permeated into the first connection electrode CP1 through the seam of the passivation layer 118, thereby damaging the first connection electrode CP1.

In the light emitting display apparatus according to an example embodiment of the present disclosure, the third inclined surface S3 of the overcoat layer 130 is configured to have a high degree of inclination in the first welding contact hole WH1 of the welding contact portion WCT and the second anode electrode AE2 is configured to cover the third inclined surface S3 of the overcoat layer 130 so that it is possible to effectively prevent the etchant from penetrating into the area between the third inclined surface S3 of the overcoat layer 130 and the passivation layer 118. Furthermore, in case of the light emitting display apparatus according to an example embodiment of the present disclosure, even though the seam exists in the passivation layer 118, it is possible to prevent the etchant from permeating into the first connection electrode CP1 through the seam of the passivation layer 118. As a result, it is possible to prevent the first connection electrode CP1 from being damaged.

In the light emitting display apparatus according to an example embodiment of the present disclosure, the first connection electrode CP1 may be formed so as not to overlap with the third inclined surface S3 of the overcoat layer 130. Therefore, the light emitting display apparatus according to an example embodiment of the present disclosure may minimize an occurrence of the seam in the passivation layer 118.

In an example embodiment, an area of the first connection electrode CP1 provided under the overcoat layer 130 formed between the first driving contact hole DH1 of the driving contact portion DCT and the first welding contact hole WH1 of the welding contact portion WCT is reduced; consequently, it is possible to reduce a step height of the passivation layer 118 in the boundary region between the third inclined surface S3 of the overcoat layer 130 and the passivation layer 118. Accordingly, a possibility of the occurrence of the seam in the boundary region between the passivation layer 118 and the third inclined surface S3 of the overcoat layer 130 may be reduced. Even if the seam occurs in the passivation layer 118, the distance between the first connection electrode CP1 and the seam of the passivation layer 118 is substantial so that the etchant does not easily penetrate.

In addition, the first connection electrode CP1 is located at a sufficient distance away from the third inclined surface S3 of the overcoat layer 130 in the light emitting display apparatus according to an example embodiment of the present disclosure. Thus, even if an error occurs during the process of forming the first driving contact hole DH1 of the driving contact portion DCT and the first welding contact hole WH1 of the welding contact portion WCT, it is possible to secure a proper separation distance from the boundary region between the third inclined surface S3 of the overcoat layer 130 and the passivation layer 118. Accordingly, the light emitting display apparatus according to an example embodiment of the present disclosure may minimize damage to the first connection electrode CP1 caused by to the etchant.

The light emitting display apparatus according to an example embodiment of the present disclosure may include a second contact hole CH2 for electrically connecting the second connection electrode CP2 to the first connection electrode CP1 with the welding contact portion WCT interposed therebetween (see, e.g., FIGS. 10 and 11), and a first contact hole CH1 for electrically connecting the first connection electrode CP1 to the driving transistor DTR (see, e.g., FIG. 6). Accordingly, the light emitting display apparatus according to an example embodiment of the present disclosure may minimize the area of the circuit area CA in the structure in which the driving contact portion DCT and the welding contact portion WCT are arranged in the first direction (for example, X-axis direction), and may greatly increase the area of the light emission area EA.

Meanwhile, the light emitting display apparatus according to an example embodiment of the present disclosure may have a light extraction structure in which a rainbow pattern (or rainbow stain pattern) and a circular ring pattern of a radiation shape, which appear when external light is reflected in the light extraction unit 140, may be minimized. Hereinafter, the light extraction structure for minimizing a rainbow pattern is described with reference to FIGS. 13A to 13C.

Figure 13A:
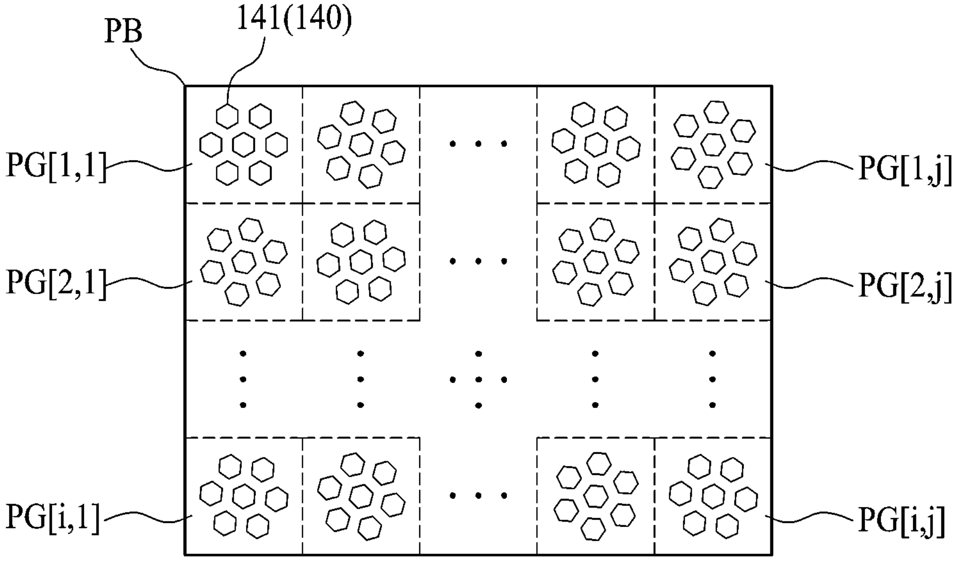
FIG. 13A is an example diagram illustrating a rotation structure of a light extraction unit for each pixel.
Figure 13B:
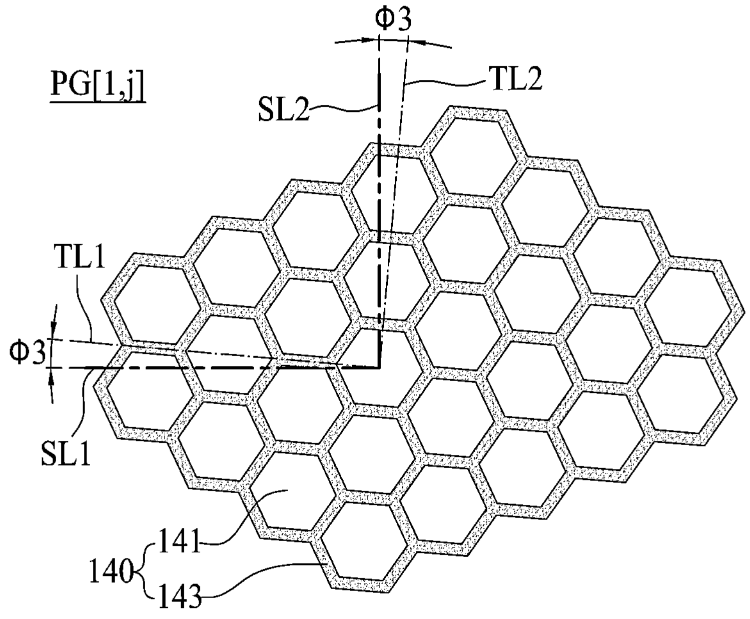
FIG. 13B is an enlarged example view of a light extraction unit in the pixel of the first row and (j)th column shown in FIG. 13A.
Figure 13C:
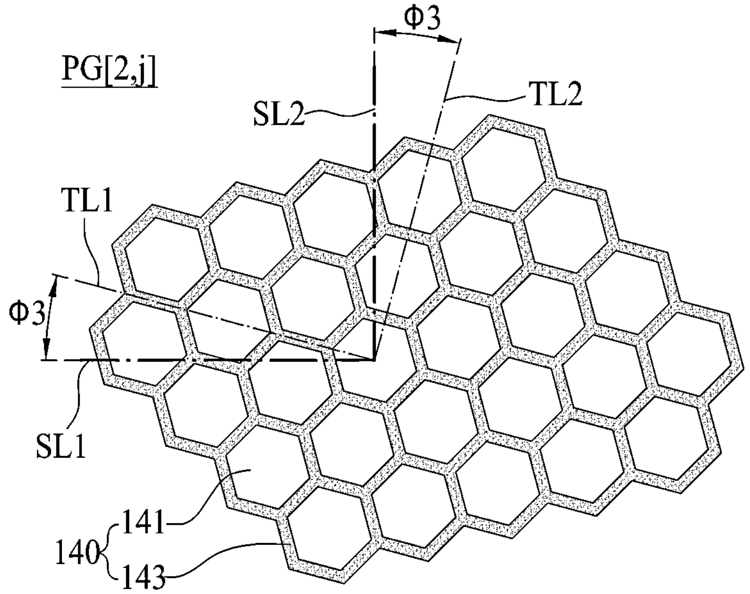
FIG. 13C is an enlarged example view of a light extraction unit in the pixel of the second row and (j)th column shown in FIG. 13A.

FIG. 13A is an example diagram illustrating a rotation structure of a light extraction unit for each pixel. FIG. 13B is an enlarged example view of a light extraction unit in the pixel of the first row and (j)th column shown in FIG. 13A. FIG. 13C is an enlarged example view of a light extraction unit in the pixel of the second row and (j)th column shown in FIG. 13A.

Referring back to FIG. 3, in the light emitting display apparatus, when external light is incident on the light extraction unit 140 in a non-driven or off state, reflective light may be generated by the convex portion 143 of the light extraction unit 140, and may be emitted to the outside through the light emitting surface in accordance with a birefringent effect of a thin film. The reflective light may generate a rainbow pattern (or a rainbow stain pattern) which is spread in a radial shape while having a rainbow color due to dispersion characteristics of light according to a difference in refractive angles for each wavelength due to material characteristics of the light emitting element 150 and a refractive index difference for each layer. For example, the reflective light may generate a radial-shaped rainbow pattern and a radial-shaped circular ring pattern in accordance with destructive interference and/or constructive interference of light, thereby reducing black visibility characteristics.

Referring to FIGS. 1, 3 and 13A to 13C, in the light emitting display apparatus according to an example embodiment of the present disclosure, the light extraction unit 140 may be configured to rotate (or horizontally rotate) at a preset angle based on a random reference point in order to reduce or minimize occurrence of a radial-shaped rainbow pattern and a radial-shaped circular ring pattern due to destructive interference and/or constructive interference of the reflective light in each of the plurality of pixels P. For example, the light extraction unit 140 disposed in one or more of the plurality of pixels P may be configured by being rotated at a rotational angle $\Phi 3$ greater than 0° and smaller than 60° based on a random reference point in a corresponding pixel area in a unit of one pixel P. In this case, the rotational angle $\Phi 3$ may be an angle between a first tilt line TL1 and a first straight line SL1 of the concave portions 141 or an angle between a second tilt line TL2 and a second straight line SL2 of the concave portions 141. For example, the rotational angle of the light extraction unit 140 disposed in each of the plurality of pixels P may be set irregularly or randomly along one or more of the first direction (e.g., X-axis direction), the second direction (e.g., Y-axis direction) and a diagonal direction within the range of the rotational angle $\Phi 3$ greater than 0° and smaller than 60°. For example, the random reference point may be a random position within the light emission area EA of each of the first to fourth subpixels SP1 to SP4 of the pixel P or may be a central portion C of any one of the plurality of concave portions 141.

Referring to FIG. 13A, the light emitting display apparatus according to an example embodiment of the present disclosure may include a plurality of pixel blocks PB. The display area DA may be divided or blocked into a plurality of pixel blocks PB. Each of the plurality of pixel blocks PB may include a plurality of pixel groups PG[1,1] to PG[i,j]. For example, each of the plurality of pixel blocks PB may include i×j number (or i number of rows and j number of columns) of pixel groups PG[1,1] to PG[i,j].

Referring to FIGS. 1 and 13A, the plurality of pixels P disposed in the display area DA may be grouped into a plurality of pixel groups PG[1,1] to PG[i,j]. For example, each of the plurality of pixel groups PG[1,1] to PG[i,j] may be configured as one pixel P.

Referring to FIGS. 1, 3 and 13A, according to an example an example embodiment of the present disclosure, one or more of the light extraction units 140 disposed in the respective pixels P of the plurality of pixel groups PG[1,1] to PG[i,j] may be configured by being rotated at a preset angle based on a random reference point in a corresponding pixel P. For example, in each of the plurality of pixel groups PG[1,1] to PG[i,j], the light extraction unit 140 disposed in each of the plurality of subpixels SP included in the pixel P may be configured to be rotated at a preset angle based on the central portion of any one concave portion 141 in the corresponding subpixel.

The rotational angles of the light extraction units 140 respectively disposed in the plurality of subpixels SP included in the pixel P of each of the plurality of pixel groups PG[1,1] to PG[i,j] may be the same as each other. For example, the rotational angles of the light extraction units 140 respectively disposed in the plurality of subpixels SP constituting one pixel P may be the same as each other. The rotational angles of the light extraction units 140 respectively disposed in the plurality of subpixels SP constituting one pixel P may be a rotational angle for each pixel. For example, the rotational angle for each pixel of the light extraction unit 140 may refer to a rotational angle of the light extraction unit 140 equally set in each of the plurality of subpixels SP constituting one pixel P.

For example, the rotational angles for each pixel of the light extraction units 140 disposed in adjacent pixel groups among the pixel groups PG[1,1] to PG[i,j] may be different from each other. For example, the rotational angles for each pixel of the light extraction units 140 respectively disposed in the pixel groups PG[1,1] to PG[i,j] may be different from each other in 10 or 3° or more. For example, the rotational angles for each pixel of the light extraction units 140 disposed in one or more non-adjacent pixel groups among the pixel groups PG[1,1] to PG[i,j] may be 0° or the same as each other, and the rotational angles for each pixel of the light extraction units 140 disposed in the other pixels may be set irregularly or randomly within the range of 0° to 60°. For example, when the rotational angles for each pixel between adjacent light extraction units 140 have a difference of 3° or more, occurrence of a radial-shaped circular ring pattern together with a radiation-shaped rainbow pattern may be effectively suppressed or minimized.

According to an example embodiment of the present disclosure, in each of the plurality of pixel blocks PB, the rotational angles for each pixel block of the light extraction units 140 respectively disposed in the i×j number of pixel groups PG[1,1] to PG[i,j] may be set differently or randomly in a unit of pixel block. For example, the rotational angles for each pixel block of the light extraction units 140 disposed in pixel blocks, which are directly adjacent to each other along any one of the first direction, the second direction and the diagonal direction, among the plurality of pixel blocks PB may have asymmetry, non-regularity or randomness. For example, the rotational angles for each pixel block of the light extraction units 140 disposed in pixel blocks, which are directly adjacent to each other along one of the first direction, the second direction and the diagonal direction, among the plurality of pixel blocks PB may be different from each other as a whole. For example, some of the rotational angles for each pixel block of the light extraction unit 140 disposed in pixel blocks, which are not directly adjacent to each other along one of the first direction, the second direction and the diagonal direction, among the plurality of pixel blocks PB may be 0° or the same as each other.

For example, as shown in FIGS. 13B and 13C, the rotational angle $\Phi 3$ of the light extraction unit 140 disposed in the pixel group PG[1,j] of 1×j (or first row and (j)th column) may be different from the rotational angle $\Phi 3$ of the light extraction unit 140 disposed in the pixel group PG[2,j] of 2×j (or second row and (j)th column). For example, the rotational angle $\Phi 3$ of the light extraction unit 140 disposed in the pixel group PG[1,j] of lxj (or first row and (j)th column) may have a difference of 1° or 3° or more with the rotational angle Φ3 of the light extraction unit 140 disposed in the pixel group PG[2,j] of 2×j (or second row and (j)th column). For example, the rotational angle Φ3 of the light extraction unit 140 disposed in the pixel group PG[1,j] of 1×j (or first row and (j)th column) shown in FIG. 13B may be 5°. The rotational angle Φ3 of the light extraction unit 140 disposed in the pixel group PG[2,j] of 2×j (or second row and (j)th column) shown in FIG. 13C may be 15°.

Therefore, in the light emitting display apparatus according to an example embodiment of the present disclosure, the rotational angles for each pixel block of the light extraction units 140 respectively disposed in the plurality of pixel blocks PB may be set differently or randomly. Further, in the light emitting display apparatus according to an example embodiment of the present disclosure, the rotational angles for each pixel of the light extraction units 140 respectively disposed in the plurality of pixel groups PG[1,1] to PG[i,j] included in each of the plurality of pixel blocks PB may be set differently or randomly. Furthermore, in the light emitting display apparatus according to an example embodiment of the present disclosure, the rotational angles for each subpixel of the light extraction units 140 respectively disposed in the plurality of subpixels included in each of the plurality of pixel groups PG[1,1] to PG[i,j] may be set differently or randomly.

Therefore, in the light emitting display apparatus according to an example embodiment of the present disclosure, a diffraction pattern of reflective light generated by reflection in the light extraction units 140 respectively disposed in the plurality of pixels P is changed in a unit of pixel. Therefore, the diffraction pattern of reflective light generated by the light extraction unit 140 of each of the plurality of pixels P may be offset or minimized, or occurrence of a radial-shaped rainbow pattern and a radial circular ring pattern of the reflective light may be suppressed or minimized due to non-regularity or randomness of the diffraction pattern of the reflective light. In the light emitting display apparatus according to an example embodiment of the present disclosure, degradation of black visibility characteristics caused by reflection of external light in a non-driving or off state may be reduced, whereby real black may be realized.

The light emitting display apparatus according to the present disclosure may be applied to all of electronic devices. For example, the light emitting display apparatus according to the present disclosure may be applied to a mobile device, a video phone, a smart watch, a watch phone, a wearable device, a foldable device, a rollable device, a bendable device, a flexible device, a curved device, an electronic diary, an electronic book, a portable multimedia player (PMP), a personal digital assistant (PDA), a motion pictures expert group audio layer 3 (MP3) player, a mobile medical device, a desktop personal computer (PC), a laptop PC, a netbook computer, a workstation, a navigator, a vehicle navigator, a vehicle display device, a television, a wall paper display device, a signage device, a game device, a laptop computer, a monitor, a camera, a camcorder, home appliances, and so on.

In accordance with one or more aspects, the present disclosure may provide high luminous efficiency even with low power by improving the light extraction efficiency of light emitted from a light emitting element layer. Accordingly, in accordance with one or more aspects of the present disclosure, the subject technology can reduce power consumption.

In addition, according to one or more aspects of the present disclosure, a first protruding portion and a second protruding portion are formed in a metal pattern provided under a welding contact portion, and a welding point can be accurately specified by using the first protruding portion and the second protruding portion. Accordingly, in accordance with one or more aspects of the present disclosure, the subject technology can increase the success rate of repair and improve product yield.

Furthermore, in accordance with one or more aspects of the present disclosure, the subject technology can arrange a driving contact unit and a welding contact unit adjacent to each other in a direction parallel to a direction in which subpixels provided in one pixel are arranged. Accordingly, the area of the circuit area can be reduced, and as a result, the area of the light emitting area can be increased.

In addition, in accordance with one or more aspects of the present disclosure, the subject technology can secure a minimum interval between a half tone mask for forming an inclined surface of a driving contact hole and a half tone mask for forming an inclined surface of a welding contact hole by forming an inclined surface formed between a driving contact portion and a welding contact portion to have a high degree of inclination when a driving contact hole and a welding contact hole are formed. Accordingly, an inclined surface can be formed in a desired shape between the driving contact hole and the welding contact hole, and an anode electrode can be stably formed in each of the driving contact hole and the welding contact hole.

Furthermore, in accordance with one or more aspects of the present disclosure, the subject technology does not need to increase the horizontal length of an area in which the driving contact portion and the welding contact portion are formed, thereby arranging the driving contact portion and the welding contact portion adjacently in the horizontal direction even in a high-resolution light emitting display apparatus.

In addition, according to one or more aspects of the present disclosure, a light extraction unit disposed adjacent to a circuit area can be stably formed by forming an inclined surface formed between a driving contact hole and a light emitting area having a light extraction unit to have a low slope when forming a driving contact hole and a welding contact hole. Accordingly, the subject technology can prevent the light extraction efficiency from being reduced while the shape of the light extraction unit disposed adjacent to the circuit region is deformed.

Moreover, in one or more aspects of the present disclosure, the anode electrode is formed to cover the inclined surface of the overcoat layer in the welding contact hole, thereby preventing the etchant from penetrating between the inclined surface of the overcoat layer and the passivation layer when the anode electrode is formed. Accordingly, even if there is a seam in the passivation layer, the etchant does not penetrate the first connection electrode through the seam of the passivation layer, and as a result, damage to the first connection electrode can be prevented.

Further, according to one or more aspects of the present disclosure, since the first connection electrode does not overlap with the inclined surface of the overcoat layer formed in the welding contact hole, the occurrence of a seam in the passivation layer in the boundary region between the inclined surface of the overcoat layer and the passivation layer can be minimized. In addition, even if a seam occurs in the passivation layer, since the distance between the first connection electrode and the seam of the passivation layer is increased, the etching solution is not easily permeated into the first connection electrode, thereby minimizing damage to the first connection electrode due to the etchant.

It will be apparent to those skilled in the art that various substitutions, modifications, and variations are possible within the scope of the present disclosure without departing from the technical idea, spirit or scope of the present disclosure. Therefore, the scope of the present disclosure is represented by the following claims, and all changes or modifications derived from the meaning, range and equivalent concept of the claims should be interpreted as being included in the scope of the present disclosure.

What is claimed is:

1. A light emitting display apparatus, comprising:

a first anode electrode provided in a subpixel of a first pixel;

a second anode electrode provided in a subpixel of a second pixel disposed adjacent to the first pixel;

a first driving transistor for supplying power to the first pixel;

a second driving transistor for supplying power to the second pixel;

a welding contact portion for electrically connecting the second anode electrode to the first driving transistor when an error occurs in the second driving transistor; and a connection electrode including a connection electrode portion overlapped with the welding contact portion, a first protruding portion protruding from the connection electrode portion in a first direction, and a second protruding portion protruding from the connection electrode portion in a second direction.

2. The light emitting display apparatus according to claim 1, wherein the welding contact portion is disposed in a region in which a first line and a second line overlap each other, the first line passes through a center of the first protruding portion and parallels to the first direction, and the second line passes through a center of the second protruding portion and parallels to the second direction.

3. The light emitting display apparatus according to claim 1, wherein the welding contact portion is disposed between the connection electrode and the second anode electrode.

4. The light emitting display apparatus according to claim 1, wherein the connection electrode is electrically connected to the first driving transistor.

5. The light emitting display apparatus according to claim 1, wherein the second anode electrode includes a second light emitting portion and a second connection portion, the second light emitting portion is provided in an emission area of the subpixel included in the second pixel, and the second connection portion extends from the second light emitting portion, and one end of the second connection portion overlaps with the welding contact portion.

6. The light emitting display apparatus according to claim 5, wherein the second connection portion is electrically separated from the connection electrode with a buffer layer in the welding contact portion, and wherein the buffer layer is interposed between the second connection portion and the connection electrode.

7. The light emitting display apparatus according to claim 5, wherein the second connection portion is electrically connected to the connection electrode while being in contact with the connection electrode in the welding contact portion when laser is irradiated to the welding contact portion.

8. The light emitting display apparatus according to claim 1, further comprising a light shielding layer disposed under the first driving transistor, wherein the connection electrode is disposed on a same layer as the light shielding layer.

9. The light emitting display apparatus according to claim 8, wherein the connection electrode is formed as one layer with the light shielding layer.

10. The light emitting display apparatus according to claim 1, further comprising:

a passivation layer provided on the connection electrode; and an overcoat layer provided on the passivation layer, wherein:

the welding contact portion includes a first welding contact hole overlapped with at least a portion of the connection electrode and a second welding contact hole overlapped with the first welding contact hole;

the first welding contact hole is in the overcoat layer; and the second welding contact hole is in the passivation layer.

11. The light emitting display apparatus according to claim 10, wherein the second welding contact hole corresponds to a welding point for irradiating laser to electrically connect the second anode electrode and the connection electrode.

12. The light emitting display apparatus according to claim 10, wherein:

the second welding contact hole is disposed in a region in which a first line and a second line are perpendicular to each other;

the first line passes through a center of the first protruding portion and is parallel to the first direction; and the second line passes through a center of the second protruding portion and is parallel to the second direction.

13. The light emitting display apparatus according to claim 10, wherein:

the first protruding portion has a first width along a direction perpendicular to a protrusion direction of the first protruding portion;

the second protruding portion has a second width along a direction perpendicular to a protrusion direction of the second protruding portion; and at least one of the first width or the second width is equal to or less than a width of the second welding contact hole.

14. The light emitting display apparatus according to claim 1, wherein the connection electrode further includes a concave portion disposed adjacent to at least one of the first protruding portion and the second protruding portion.

15. The light emitting display apparatus according to claim 1, wherein a subpixel included in the first pixel and a subpixel included in the second pixel are configured to emit light of a same color.

16. A light emitting display apparatus, comprising:

a substrate;

a subpixel including an emission area and a circuit area;

a light emitting element provided in the emission area on the substrate and configured to include an anode electrode, a light emitting layer, and a cathode electrode;

a driving transistor provided in the circuit area on the substrate;

a first connection electrode electrically connected to the driving transistor;

a second connection electrode provided on a layer different from the first connection electrode and electrically connected to the driving transistor; and an organic insulating layer disposed on the first connection electrode and the second connection electrode and configured to include a first driving contact hole overlapped with at least a portion of the first connection electrode and a first welding contact hole overlapped with at least a portion of the second connection electrode, wherein the second connection electrode includes a connection electrode portion overlapped with the first welding contact hole, a first protruding portion protruding from the connection electrode portion in a first direction, and a second protruding portion protruding from the connection electrode portion in a second direction.

17. The light emitting display apparatus according to claim 16, wherein the first welding contact hole is disposed in a region in which a first line and a second line overlap each other, the first line passes through a center of the first protruding portion and parallels to the first direction, and the second line passes through a center of the second protruding portion and parallels to the second direction.

18. The light emitting display apparatus according to claim 16, further comprising an inorganic insulating layer disposed between the organic insulating layer and the first connection electrode and configured to include a second driving contact hole overlapped with the first driving contact hole and a second welding contact hole overlapped with the first welding contact hole.

19. The light emitting display apparatus according to claim 18, wherein the second welding contact hole is disposed in a region in which a first line and a second line overlap each other, the first line passes through a center of the first protruding portion and parallels to the first direction, and the second line passes through a center of the second protruding portion and parallels to the second direction.

20. The light emitting display apparatus according to claim 18, wherein the anode electrode of the light emitting element provided in the subpixel is disposed while being overlapped with the first driving contact hole and the second driving contact hole, and an anode electrode of another light emitting element provided in an adjacent subpixel disposed adjacent to the subpixel in the second direction is overlapped with the first welding contact hole and the second welding contact hole.

21. The light emitting display apparatus according to claim 20, wherein:

the anode electrode of the light emitting element provided in the subpixel is electrically connected to the first connection electrode while being in contact with the first connection electrode in the second driving contact hole;

the anode electrode of the another light emitting element provided in the adjacent subpixel is spaced apart from the second connection electrode with a buffer layer in the second welding contact hole to be electrically separated from the second connection electrode; and the buffer layer is disposed between the second connection electrode and the anode electrode of the another light emitting element.

22. The light emitting display apparatus according to claim 20, wherein the second welding contact hole corresponds to a welding point for irradiating laser to electrically connect the anode electrode of the another light emitting element provided in the adjacent subpixel to the second connection electrode.

23. The light emitting display apparatus according to claim 16, wherein the first driving contact hole and the first welding contact hole are disposed adjacent to each other in the first direction.

24. The light emitting display apparatus according to claim 16, wherein the first connection electrode is disposed on a same layer as a gate electrode of the driving transistor, and the second connection electrode is disposed on a layer between the substrate and the driving transistor.

25. The light emitting display apparatus according to claim 24, wherein the first connection electrode includes a first electrode pattern overlapped with the first driving contact hole, a second electrode pattern protruding from the first electrode pattern and provided above the first welding contact hole, and a third electrode pattern protruding from the first electrode pattern and provided under the first welding contact hole.

26. The light emitting display apparatus according to claim 25, wherein the first electrode pattern of the first connection electrode is electrically connected to the anode electrode of the light emitting element provided in the subpixel through the first driving contact hole, and the second electrode pattern of the first connection electrode is electrically connected to the driving transistor through a first contact hole.

27. The light emitting display apparatus according to claim 25, wherein the third electrode pattern of the first connection electrode is electrically connected to the second connection electrode through a second contact hole.

* * * * *